United States Patent [19]
Koike

[11] Patent Number: 5,617,349
[45] Date of Patent: Apr. 1, 1997

[54] FERROELECTRIC MEMORY AND METHOD FOR CONTROLLING OPERATION OF THE SAME

[75] Inventor: Hiroki Koike, Tokyo, Japan

[73] Assignee: NEC Corporation, Tokyo, Japan

[21] Appl. No.: 582,960

[22] Filed: Jan. 4, 1996

[30] Foreign Application Priority Data

Jan. 4, 1995 [JP] Japan .................................. 7-000064

[51] Int. Cl.$^6$ ...................................... G11C 7/00
[52] U.S. Cl. ............................ 365/145; 365/149
[58] Field of Search ..................... 365/145, 149

[56] References Cited

U.S. PATENT DOCUMENTS

| | | | |
|---|---|---|---|
| 4,873,664 | 10/1989 | Eaton, Jr. ................. | 365/145 |
| 5,262,982 | 11/1993 | Brassington et al. ........ | 365/145 |
| 5,515,312 | 5/1996 | Nakakuma et al. .......... | 365/145 |

FOREIGN PATENT DOCUMENTS 63-201998  8/1988  Japan .

OTHER PUBLICATIONS

1988 IEEE International Solid–State Circuits Conference (ISSCC), Feb. 18, 1988, Digest of Technical Papers, pp. 130–131.

1994 IEEE International Solid–State Circuits Conference (ISSCC), Feb. 18, 1994, Digest of Technical Papers, pp. 268–269.

Primary Examiner—Son T. Dinh
Attorney, Agent, or Firm—Sughrue, Mion, Zinn, Macpeak & Seas

[57] ABSTRACT

A ferroelectric memory includes a circuit for temporarily controlling a parasitic capacitance of a pair of data signal lines to an optimum value when data is read out from a memory cell, for the purpose of minimizing a variation of the voltage on the pair of data signal lines caused by factor other than the current caused due to the polarization of the ferroelectric capacitor. Thus, a voltage not smaller than the coercive voltage can be applied between the opposing electrodes of the ferroelectric capacitor, with the result that a sufficient read-out signal voltage can be obtained.

33 Claims, 31 Drawing Sheets

FERROELECTRIC MEMORY AND METHOD FOR CONTROLLING OPERATION OF THE SAME

BACKGROUND OF THE INVENTION

1. Field of the Invention

The present invention relates to a ferroelectric memory and a method for controlling an operation thereof.

2. Description of Related Art

Recently, a non-volatile memory including memory cells composed of a ferroelectric material such as lead zirconate titanate (PZT) having a hysteresis characteristics so that even if a power supply is shut down, a stored content is held. Some examples of this type memory have been reported in Japanese Patent Application Laid-open Publication No. JP-A-63-201998 (which corresponds to U.S. Pat. Nos. 4,873,664), 1988 IEEE International Solid-State Circuits Conference (ISSCC), Feb. 18, 1988, Digest of Technical Papers, pages 130–131, and 1994 IEEE International Solid-State Circuits Conference (ISSCC), Feb. 18, 1994, Digest of Technical Papers, pages 268–269, the disclosure of which is incorporated by reference in its entirety into this application.

Now, based on these reports, a circuit construction and an operation of the conventional non-volatile ferroelectric memory will be described.

Referring to FIG. 1, there is shown a circuit of ferroelectric memory cell, which is disclosed in JP-A-63-201998 and in which one memory cell is constituted of two transistors and two capacitors (called a "2T/2C type" hereinafter). In FIG. 1, Reference Numeral 11 designates a memory cell selection signal line (called simple "selection signal line" hereinafter), and Reference Numeral 13 shows a plate line. Reference Numerals 12 and /12 indicate a pair of complementary signal lines, and Reference Numeral 101 designates a memory cell. Here, in this specification, "/" put just before Reference Numeral such as "12" indicates an upper bar given to the just succeeding Reference Numeral, and means to take a condition complementary to the condition of one given with the same Reference Numeral without "/". Reference Numerals 102 and 103 show switching transistors of the memory cell, and Reference Numerals 104 and 105 indicate ferroelectric capacitors.

In the 2T/2C type memory cell as mentioned above, data is written into the ferroelectric capacitors 104 and 105 in such a manner that the ferroelectric capacitors 104 and 105 always have polarization directions opposite to each other. Electric charges from the ferroelectric capacitors 104 and 105 always have polarization directions opposite to each other, are read out to the pair of data signal lines 12 and /12, so that a voltage difference is generated between the pair of data signal lines, and amplified by a sense amplifier which is composed of a differential amplifier circuit.

Referring to FIG. 2, there is shown a mode of the hysteresis characteristics of the ferroelectric capacitors 104 and 105, which indicates a relation between a spontaneous polarization electric charge Q and a voltage V between opposing electrodes of the ferroelectric capacitor. In addition, a polarization electric charge at the voltage of 0 V, will be called a remnant polarization electric charge $Q_r$. For example, it is considered that when the ferroelectric capacitors 104 and 105 are polarized in conditions A and B, respectively, data "1" is stored, and when the ferroelectric capacitors 104 and 105 are polarized in conditions B and A, respectively, data "0" is stored. At this time, when a voltage of Ve is applied between the opposing electrodes of each ferroelectric capacitor, if the data "1" is stored, an electric charge "$Q_1$" is outputted from the capacitor 104 to the data signal line 12 and an electric charge "$Q_0$ is outputted from the capacitor 105 to the data signal line/12. These electric charges will generate a voltage difference between the pair of data signal lines, as mentioned above. Incidentally, a relation between the remnant polarization electric charge $Q_r$ and the output electric charges $Q_0$ and $Q_1$ is ideally expressed as follows:

$$2 \times Q_r = |Q_1 - Q_0| \tag{1}$$

In the above mentioned memory using the ferroelectric capacitor, even if an external voltage applied between the opposing electrodes of each ferroelectric capacitor becomes zero, since the spontaneous polarization internally occurring in the ferroelectric material maintains the data, the data is held after the electric supply is shut down. In other words, so called non-volatile memory operation is realized.

Referring to FIG. 3, there is shown a partial circuit of a memory cell array in a ferroelectric memory using the memory cell of the type shown in FIG. 1. In FIG. 3, Reference Numerals 11A to 11C designate a selection signal line, and Reference Numerals 12A and/12A and 12B and/12B show a data signal line. Reference Numerals 13A to 13C indicate a plate line, and Reference Numeral 14 designates a date signal line precharge control line. Reference Numeral 15 shows a data signal line precharge voltage line, and Reference Numeral 16 indicates a sense amplifier control line. Reference Numerals 101A to 101F each designate a memory cell. Reference Numerals 102A and 103A show a switching transistor of the memory cell, and Reference Numerals 104A and 105A indicate a ferroelectric capacitor of the memory cell. Reference Numerals 106A and 106B designate a data signal line precharge circuit, and Reference Numerals 107A and 107B show a sense amplifier.

Now, a reading operation and a writing operation of the memory cell 101A in the ferroelectric memory will be described with reference to FIG. 3 and FIG. 4 which is a timing chart illustrating an operation of the memory cell shown in FIG. 3. Incidentally, in this specification, unless specially indicated, a logical "high level" correspond to a power supply voltage applied from an device external to the memory, or a voltage generated in an internal voltage generating circuit of the memory, and a logical "low level" is a ground level. Accordingly, these voltages can take various values, for example, 5 V, 3 V, etc., dependent upon the case. Furthermore, for reference, the polarized condition of each of the ferroelectric capacitors 104A and 105A at an end of each of periods (1) to (6) in FIG. 4 is shown below the timing chart in FIG. 4.

In FIG. 4, the periods (1) to (3) show the operation of reading out data from the memory cell. In the period (1), the data signal line precharge control signal 14 is brought to the low level, so as to cancel the precharge condition of the data signal line. Here, the data signal line precharge level is the ground level.

In the next period (2), the selection signal line 11A and the plate line 13A are brought to the high level, so that data is caused to be outputted from the memory cell 101A to the data signal lines 12A and /12A. The data outputted at this time, is determined by the internal polarization condition of the ferroelectric capacitor. The example shown in FIG. 4 shows the reading of the data "1", as will be seen from the explanation made hereinbefore.

In the succeeding period (3), the sense amplifier control line 16 is activated, so that the voltage difference between the pair of data signal line 12A and/12A is sense-amplified.

The periods (4) to (6) illustrate the operation of re-writing the read-out data to the memory cell. At the time of the period (2), since the data of the read-out memory cell is destroyed, this re-writing is necessary. Incidentally, in the case of writing the memory cell with data supplied from a device external to the memory, it is necessary to set a pair of voltages corresponding to a desired data to be written, onto the pair of data signal lines 12A and /12A during the period (3), before the operation of the succeeding periods (4) to (6) is performed.

During the period (4), the plate line 13A is brought to the low level. In the next period (5), the sense amplifier control signal line 16 is brought to the low level, so as to deactivate the sense amplifier, and furthermore, the precharge control signal line 14 is brought to the high level and the data signal lines are brought to the ground level. With this arrangement, the polarization of the capacitors is returned to the condition of the period (1) before the data reading. Finally, during the period (6), the selection signal line 11A is brought to the low level, so as to render the memory cell transistors (switching transistors) non-conductive. Thus, the access to the memory cell is completed.

When the data "0" is stored in the memory cell 101A, the respective polarization conditions of the capacitors 104A and 105A become opposite to those shown in FIG. 4.

Here, a relation between the above mentioned circuit operation and the characteristics of the ferroelectric capacitor will be discussed. For example, the condition of the period (2) of FIG. 4 in which the selection signal line 11A is brought to the high level so as to turn on the switching transistors 102A and 103A and the plate line 13A is brought to the high level, corresponds to the condition in which the voltage of −Ve is applied to the ferroelectric capacitor (assuming that a direction from the plate line to the data signal line is positive in voltage). At this time, the electric charge Q1 or Q0 is outputted to the data signal line 12A. However, regardless of which of the "1" and "0" is stored, the polarization of the ferroelectric capacitor in this condition is at a point "h" as shown in FIG. 2, and therefore, it is not possible to discriminate "1" or "0". Therefore, it is necessary to re-write the data by applying the voltage +Ve or 0 dependent upon the read-out data "1" or "0", to the ferroelectric capacitor. This operation corresponds to the operation during the periods (4) and (5) in FIG. 4.

As mentioned above, in order to realize the non-volatile memory operation by using the ferroelectric memory cell, it is necessary to apply both positive and negative voltages between the opposing electrodes of the ferroelectric capacitor.

In order to realize a high density of memory, them is a memory cell composed of one transistor and one ferroelectric capacitor (hereinafter, called a "1T/1C type"). This type of ferroelectric memory cell is reported in 1994 IEEE International Solid-State Circuits Conference (ISSCC), Feb. 18, 1994, Digest of Technical Papers, pages 268–269.

Referring to FIG. 5, one example of the 1T/1C type of ferroelectric memory cell is illustrated. In FIG. 5, Reference Numeral 11 designates a memory cell selection signal line, and Reference Numeral 12 indicates a signal line. Reference Numeral 13 shows a plate line, and Reference Numeral 101 designates a memory cell. Reference Numeral 102 shows a switching transistor of the memory cell, and Reference Numeral 104 indicates a ferroelectric capacitor. In the following, it is to be noted that elements corresponding or similar to those shown in the preceding drawings are given the same Reference Numerals, and explanation thereof will be omitted.

In addition, FIG. 6 shows a model of the hysteresis characteristics of the ferroelectric capacitor 104 shown in FIG. 5. In contrast to the 2T/2C type memory cell, in the 1T/1C type memory cell, the two stable conditions "A" and "B" of the ferroelectric capacitor are considered to correspond the data "1" and "0", respectively.

Referring to FIG. 7, there is shown a partial circuit diagram of a memory cell array using the 1T/1C type memory cell. In this case, for example, when the memory cell 101A is selected, a signal voltage from the memory cell appears only on the data signal line 12A. Thus, when the 1T/1C type memory cell is used, it is necessary to generate a reference level used in the sense amplification, on a pairing data line /12A, by circuit of a special means. For this purpose, the circuit shown in FIG. 7 additionally includes reference level generating circuits 108A to 108D and control signal lines 17A and 17B for the circuits 108A to 108D. A specific method for generating the reference level, is disclosed for example in the above referenced 1994 IEEE International Solid-State Circuits Conference (ISSCC), Feb. 18, 1994, Digest of Technical Papers, "Transaction of International Solid-State Circuits Conference (ISSCC)", pages 268–269. The key point of the reference level generation is to generate an intermediate voltage between the data signal line voltage when the signal corresponding to "1" is read out from the memory cell and the data signal line voltage when the signal corresponding to "0" is read out from the memory cell.

Referring to FIG. 8, there is illustrated a timing chart of an operation of the memory cell 101A in the circuit shown in FIG. 7. Furthermore, for reference, the polarized condition of each of the ferroelectric capacitors 104A at an end of each of periods (1) to (6) in FIG. 4 when the data "1" is read, is shown below the timing chart in FIG. 8.

In the case of reading the signal to the data signal line 12A, the reference level generating circuit 108B is controlled to generate the reference level on the pairing data signal line /12A, so that the reference level generated by the reference level generating circuit 108B is read out to the data signal line /12A. The other operation is the same as that of the 2T/2C type memory cell, and further explanation will be omitted for simplification of description.

Furthermore, 1988 IEEE International Solid-State Circuits Conference (ISSCC), Feb. 18, 1988, Digest of Technical Papers, pages 130–131, proposed an example of non-volatile memory in which a ferroelectric capacitor is combined with a flipflop of the type used in a static random access memory (SRAM) (This type memory will be called a "SRAM+ferroelectric memory cell" hereinafter).

Referring to FIG. 9, there is shown a circuit diagram of one memory cell of the "SRAM+ferroelectric memory cell" memory. In FIG. 9, Reference Numeral 18 designates a selection line for an SRAM part, and Reference Numerals 19 and /19 indicate a pair of complementary data signal lines for the SRAM part. Reference Numerals 20 and 21 show a flipflop power supply line. In addition, Reference Numeral 109 designates a flipflop, and Reference Numerals 110 and 111 indicate an N-channel MOS transistor constituting the flipflop. Reference Numerals 112 and 113 show a P-channel MOS transistor constituting the flipflop, and Numerals 114 and 115 show a memory cell selection transistor.

In the memory using this type of memory cell, after the memory is powered on, data is transferred from the ferroelectric capacitor to the flipflop, and when the memory is in a powered-on condition, the memory cell is used as the SRAM cell. Before the memory is powered off, data is transferred from the flipflop to the ferroelectric capacitor, so that after the memory is powered off, the data is held.

Here, causing various elements in FIG. 9 to correspond to various elements shown in FIGS. 1 and 5, the memory cell selection signal line and the data signal lines for the "SRAM+ferroelectric memory cell" memory are the lines 18 and 19 and/19, but the memory cell selection signal line and the data signal lines for the ferroelectric memory are the lines 11 and 12 and/12. In addition, the transfer gate for transferring the data from the ferroelectric capacitor to the data signal line is the transistors 102 and 103. As mentioned hereinbefore, in FIG. 9, elements corresponding or similar to those shown in FIGS. 1 and 5 are given the same Reference Numerals.

Referring to FIG. 10, there is shown a timing chart illustrating an operation of writing data to the ferroelectric capacitors 104 and 105 and an operation of reading data from the ferroelectric capacitors 104 and 105 to the flipflop 109. Correspondence between the polarized condition of the capacitors 104 and 105 and the data "1" and "0" is similar to the case shown in FIG. 2. Furthermore, for reference, the polarized condition of each of the ferroelectric capacitors 104 and 105 at an end of each of periods (1) to (10) in FIG. 10 in the case of writing and reading the data "1", is shown below the timing chart in FIG. 10.

In the case of writing the data from the flipflop 109 to the ferroelectric capacitors 104 and 105, the signal selection line 11 is brought to the high level during the period (1) in which the flipflop 109 holds the data (in the shown example, the data signal line 12 is at the high level and the data signal line/12 is at the low level). In the succeeding periods (2) and (3), the plate line 13 is brought from the low level to the high level, and then, from the high level to the low level. Thereafter, during the period (4), the flipflop power supply line 21 is brought to the low level, so as to power down the flipflop. Lastly, during the period (5), the selection signal line 11 is brought to the low level. Thus, in the capacitors 104 and 105, the polarized condition corresponding to the data stored in the flipflop 109 is set. Thereafter, even if the memory is powered off, the data is held.

In the case of reading data from the capacitors 104 and 105 to the flipflop 109, during the period (6), the selection signal line 11 is brought to the high level, and during the next period (7), the plate line 13 is driven from the low level to the high level, so that a voltage is applied between the opposing electrodes of the capacitors 104 and 105 so as to read an electric charge corresponding to the polarized condition, onto the data signal lines 12 and/12. Thereafter, during the period (8), the flipflop power supply line 21 is brought to the high level to activate the flipflop, so that the signal voltage read out during the period (7) is amplified. During the next period (9), the plate line 13 is returned to the low level, and then, during the period (10), the signal selection line 11 is returned to the low level, to terminate the data reading operation. Thereafter, the memory cell can be used as the conventional SRAM.

In FIG. 10, at the end of the period (1), the polarized condition of the capacitor 15 is indefinite, but at the end of the period (5), the polarized condition is definite. Therefore, it is not a problem that the polarized condition of the capacitor 15 is indefinite at the end of the period (1). In addition, at the end of the period (10), the voltage is applied to the opposing electrodes of the capacitor 104, and therefore, the polarized condition does not correspond to the voltage "0". However, this is not a problem, since the polarized condition is determined at a next time of writing the data. When the data "0" is stored in the flipflop 109, the polarized condition of the capacitors 104 and 105 becomes opposite to the case shown in FIG. 10.

In the shown example, it is possible to use a passive element such as a resistor in place of the P-channel transistors 112 and 113 in FIG. 9.

The above mentioned example adopts a system of reading the data by driving all the plate lines 13 from the low level to the high level so as to apply both positive and negative voltages to the opposing electrodes of the ferroelectric capacitor. However, it is possible to read the data by setting an intermediate voltage on the plate lines so as to apply both positive and negative voltages to the opposing electrodes of the ferroelectric capacitor. Referring to FIG. 11, there is shown a partial circuit diagram of a memory cell array of a memory adopting such a data reading system. In FIG. 11, Reference Numerals 116A and 116B designate a data signal line precharge balance control circuit, and Reference Numeral 22 shows a data signal line balance control signal line. The other construction is the same as that shown in FIG. 7.

Referring to FIG. 12, there is shown a timing chart illustrating an operation of the memory shown in FIG. 11. Here, it is to be noted that the plate line 13 is fixed to an intermediate between the high level voltage and the low level voltage. Now, the reading and writing operations of the memory cell 101A will be described with reference to FIGS. 11 and 12. Furthermore, for reference, the polarized condition of each of the ferroelectric capacitors 104A at an end of each of periods (1) to (7) in FIG. 12 is shown below the timing chart in FIG. 12.

First, during the period (1), the data signal line precharge control signal 14 is brought to the low level, so as to cancel the precharging condition of the data signal line. Here, the precharge level of the data signal line is the ground level, similar to the above mentioned examples. During the next period (2), the selection signal line 11A is brought to the high level, so as to output the data from the memory cell 101A to the data signal line 12A. Here, a point different from the previously described is that the plate line 13 is not driven. Since the precharge level of the data signal line is the ground level and the plate line is an intermediate voltage (called Vm), when the memory cell transistor 102A is rendered conductive during the period (2), a voltage of almost −Vm is applied between the opposing electrodes of the ferroelectric capacitors 104A, assuming that the direction from the plate line to the data signal line is a positive voltage. As a result, a signal voltage corresponding to the polarized condition of the ferroelectric capacitor 104A is read out to the data signal line 12A. At the same time, a reference level is applied to the pairing data signal line/12A from the circuit 10813. In the succeeding period (3), the sense amplifier control signal line 16 is activated to sense-amplify a voltage difference between the pair of data signal lines 12A and/12A.

Incidentally, in the case of writing the memory cell with data supplied from a device external to the memory, it is necessary to set a pair of voltages corresponding to a desired data to be written, onto the pair of data signal lines 12A and/12A during the period (4).

During the period (5), the sense amplifier control signal line 16 is brought to the low level so as to deactivate the sense amplifier. In addition, the data signal line balance control signal line 22 is brought to the high level, so as to bring the data signal line level to the intermediate voltage Vm which is the same as that of the plate line. With this arrangement, the polarization of the memory cell capacitor can be returned to the condition just before the data reading.

During the period (6), the selection signal line 11A is brought to the low level, so as to render the memory cell transistor non-conductive. Thereafter, during the period (7), the pair of data signal lines 12A and /12A are precharged to the ground level. Thus, one cycle of a memory cell access operation is completed.

The signal voltage read out from the ferroelectric capacitor depends upon the magnitude of the voltage applied between the opposing electrodes of the ferroelectric capacitor. Generally, the larger the voltage applied between the opposing electrodes of the ferroelectric capacitor is, the larger the obtained signal voltage becomes. In the operation of the above mentioned ferroelectric memory, the magnitude of the voltage applied between the opposing electrodes of the ferroelectric capacitor depends upon the voltage set on the plate line and the amplitude of the voltage of the data signal line. Accordingly, the set voltage of the plate line and the amplitude of the voltage of the data signal line may be set to any value if they make it possible for the sense amplifier to properly sense-amplify the signal voltage read out from the ferroelectric capacitor. For example, there is a method of making the set voltage of the plate line to one half of the power supply voltage and of making the amplitude of the voltage of the data signal line between the ground voltage and the power supply voltage. Here, the power supply voltage may be supplied from an external of the memory or may be a voltage generated by a voltage generating circuit provided internally in the memory.

Referring to FIG. 13, there is shown a specific circuit of the data signal line precharge balance control circuit 11 6A and 116B. Data signal line precharge transistors 117 and 118 are similar to those shown in FIGS. 3 and 7, and additionally, a data signal line balance transistor 119 is provided between the pair of data signal lines 12 and /12. In a condition that the data signal lines 12 and /12 are at the power supply voltage and the ground voltage, respectively, if the transistor 119 is turned on, since the data signal lines 12 and/12 have the same parasitic capacitance, the data signal lines 12 and/12 become a half of the power supply voltage. This circuit is effective when the set voltage of the plate line is similarly a half of the power supply voltage.

The example shown in FIGS. 11 and 12 has been explained in the case of the 1T/1C type memory cell. However, the ferroelectric memory operating without dynamically driving the plate line is not limited by the type of the memory cell. The 2C/2T type shown in FIG. 3 and the "SRAM+ferroelectric memory cell" type shown in FIG. 9 can similarly operate by drive-controlling the corresponding signal lines similar to the example shown in FIG. 12.

In the examples shown in FIG. 4, 8, 10 and 12, the precharge level of the data signal line is at the ground level. However, the precharge level of the data signal line is not limited to the ground level and may be any value so long as non-zero voltage is applied between the opposing electrodes of the ferroelectric capacitor when the selection signal line 11A is brought to the high level.

However, the above mentioned conventional ferroelectric memory has such a problem that when data is read out from the memory cell, a sufficient voltage is not applied between the opposing electrodes of the ferroelectric capacitor because of the following reasons:

In the ferroelectric memory operating while dynamically driving the plate line as the examples explained with reference to FIGS. 4, 8 and 10 (hereinafter called a "plate drive type"), when the data is read out from the memory cell, the bit line becomes floating. Therefore, when the plate line is driven from the low level to the high level, the voltage of the data signal line varies by action of a coupling through the ferroelectric capacitor of the memory cell. As a result, a voltage not smaller than a coercive voltage Vc converted by multiplying a coercive electric field Ec by a film thickness of the ferroelectric material, is often not applied between the opposing electrodes of the ferroelectric capacitor. Accordingly, the polarization inversion of the ferroelectric material does not occur.

This will be explained in detail with reference to FIG. 14, which illustrates the circuit of the 1T/1C type ferroelectric memory cell. In FIG. 14, a parasitic capacitance of the data line is represented by CD, and the capacitance of the normal dielectric component of the ferroelectric capacitor is represented by CS.

Now, assume that in a condition that the memory cell switching transistor 102 is non-conductive, namely, the memory cell 101 is in a non-selected condition, a voltage VBOOT for turning on the transistor 102 is applied to the selection signal line 11. In addition, the plate line 13 is driven from an initial condition voltage VPL0 to a final condition voltage VPL. Furthermore, it is assumed that an initial voltage and a final voltage of the data signal line 12 are VDL0 and VDL, respectively. Additionally, an initial voltage of a node 23 interconnecting the transistor 102 and the ferroelectric capacitor 104 is VS0 and a final voltage of the node 23 becomes VDL since the transistor 102 is turned on.

Under the above mentioned condition, the operation of the memory can be described as follows.

All electric charge Qi of the system shown in FIG. 14 in an initial condition, is expressed as follows:

$$Qi = CS \times (VS0 - VPL0) + CD \times VDL0 \quad (2)$$

All electric charge Qf of the system shown in FIG. 14 in a final condition, is expressed as follows:

$$Qf = CS \times (VDL - VPL) + CD \times VDL \quad (3)$$

Since Qi must be equal to Qf, an absolute value |VPL−VDL| of the voltage applied between the opposing electrodes of the ferroelectric capacitor is expressed as follows:

$$|VPL - VDL| = \left| \frac{CS \times (VPL0 - VS0) + CD \times (VPL - VDL0)}{CD + CS} \right| \quad (4)$$

On the other hand, |VPL−VDL| must be not smaller than the coercive voltage Vc of the ferroelectric capacitor. The relationship can be expressed:

$$|VPL-VDL| \geq Vc. \quad (5)$$

Here, assuming that the precharge voltage of the data signal line is the ground voltage (namely, VDL0=0) and both of the VS0 and VPL0 are the ground level, the equation (5) can be expressed as follows:

$$\left| \frac{CD \times VPL}{CD + CS} \right| \geq Vc \quad (6)$$

Here, assume that Vc=1.5 V and VPL=3.3 V, the equation (6) can be expressed as follows:

$$CD \geq 0.833 \cdots \times CS \quad (7)$$

This equation (7) indicates that since the parasitic capacitance CD of the data signal line has a lower limit, unless the parasitic capacitance is larger than the lower limit, a voltage larger than Vc is not applied between the opposing electrodes of the ferroelectric capacitor. Thus, since the voltage of the data signal line is caused to vary by action of the coupling through the ferroelectric capacitor by dynamically driving the plate line, it is generally said that unless the condition by defined by the equations (4) and (5) is fulfilled, a sufficient read-out voltage cannot be obtained from the memory cell.

On the other hand, in the ferroelectric memory operating without dynamically driving the plate line, as in the examples explained with reference to FIG. 12 (hereinafter called a "plate non-drive type"), a problem similar to that of the plate non-drive type occurs, even if the mechanism causing the problem is different from that in the plate drive type.

In the plate non-drive type of ferroelectric memory, when the memory cell is not accessed, it is necessary to maintain the voltage applied between the opposing electrodes of the ferroelectric capacitor at zero, in order to prevent break of the stored data. In other words, if the plate line is set to the intermediate voltage, a node of one opposing electrode of the ferroelectric capacitor, namely, a node 23 interconnecting the memory cell switching transistor 102 and the ferroelectric capacitor similarly becomes the intermediate voltage. In this condition, if the selection signal line is brought to the high level in order to read out data from the memory cell, first, the electric charge stored in the node 23 interconnecting the memory cell switching transistor 102 and the ferroelectric capacitor similarly becomes the intermediate voltage, is outputted to the data signal line, so that the voltage level of the data signal line changes from the precharge level. As a result, the voltage not smaller than the coercive voltage Vc is not applied between the opposing electrodes of the ferroelectric capacitor, so that the polarization inversion of the ferroelectric material no longer occurs.

This will be explained in detail with reference to FIG. 15, which is similar to FIG. 14, except that the voltage of the plate line 13 is fixed to a constant value VPLC.

Now, consider that an initial condition that the memory cell switching transistor 102 is non-conductive, namely, the memory cell 101 is in a non-selected condition, is changed to a final condition after a voltage VBOOT is applied to the selection signal line 11 so as to turn on the transistor 102.

Except for the condition that the voltage of the plate line 13 is VPLC, the same condition as that explained with reference to FIG. 14 is applied.

All electric charge Qi of the system shown in FIG. 15 in an initial condition, is expressed as follows:

$$Qi = CS \times (VS0 - VPLC) + CD \times VDL0 \qquad (8)$$

All electric charge Qf of the system shown in FIG. 15 in a final condition, is expressed as follows:

$$Qf = CS \times (VDL - VPLC) + CD \times VDL \qquad (3)$$

Since Qi must be equal to Qf, an absolute value |VPL−VDL| of the voltage applied between the opposing electrodes of the ferroelectric capacitor in the final condition is expressed as follows:

$$|VPLC - VDL| = \left| \frac{CS \times (VPLC - VS0) + CD \times (VPLC - VDL0)}{CD + CS} \right| \qquad (10)$$

On the other hand, |VPLC−VDL| must be not smaller than the coercive voltage Vc of the ferroelectric capacitor, similar to the plate drive type, the following relation can be expressed:

$$|VPLC - VDL| \geq Vc. \qquad (11)$$

Here, assuming that the precharge voltage of the data signal line is the ground voltage (namely, VDL0=0) and both of the VS0 and VPLC are one half of the power supply voltage Vcc, the equation (11) can be expressed as follows:

$$\frac{1}{2} \times \left| \frac{CD \times Vcc}{CD + CS} \right| \geq Vc \qquad (12)$$

Here, assume that Vc=1.5 V and Vcc=3.3 V, the equation (12) can be expressed as follows:

$$CD \geq 10 \times CS \qquad (13)$$

Similar to the equation (7), this equation (13) indicates that the parasitic capacitance CD of the data signal line has a lower limit. Also in the plate non-drive type ferroelectric memory, it is generally said that unless the condition defined by the equations (10) and (11) is fulfilled, a sufficient read-out voltage cannot be obtained from the memory cell.

The above mentioned discussion is directed to the lower limit of the parasitic capacitance CD of the data signal line. However, in the reading method in which the signal charge read out from the memory cell is outputted onto the data signal line as the signal voltage, if the 2T/2C type memory cell is used, the signal voltage VSIG is expressed as follows by using the electric charges Q0 and Q1 shown in FIG. 2 and the electric charge Qr mentioned hereinbefore:

$$VSIG = \left| \frac{Q1 - Q0}{CD + CS} \right| = \frac{2 \times Qr}{CD + CS} \qquad (14)$$

Here, the equation (1) mentioned hereinbefore was used.

In addition, in the method of using the 1T/1C type memory cell and also using the reference level generating circuit for generating the reference level, the signal voltage VSIG is expressed as follows by using the electric charges Q0 and Q1 shown in FIG. 2 and the electric charge Qr and the equation (1) mentioned hereinbefore:

$$VSIG = \frac{1}{2} \times \left| \frac{Q1 - Q0}{CD + CS} \right| = \frac{Qr}{CD + CS} \qquad (15)$$

In the above equation, the factor (½) means that the reference level is determined to be an intermediate level between the voltage of the data signal line when the data "0" is read out and the voltage of the data signal line when the data "1" is read out. If the reference level generated by the reference level generating circuit is shifted from the intermediate level, the factor in question no longer is ½, but a value larger than 0 (zero) but smaller than 1.

Furthermore, the signal voltage VSIG defined by the equations (14) and (15) must exceed the minimum voltage value VSE which can be normally amplified by the sense amplifier. Namely, $$VSIG \geq VSE \qquad (16)$$

Namely, the equation (16) means that if the parasitic capacitance CD exceeds a certain value, the signal voltage VSIG becomes too small and therefore smaller than the minimum voltage value VSE which can be normally amplified by the sense amplifier. In other words, the memory cannot operate. Therefore, the parasitic capacitance CD has an upper limit.

Considering the above mentioned matters, the ferroelectric memory generally has a relation between the parasitic capacitance CD and the normal dielectric capacitance CS as shown in FIG. 16. In FIG. 16, the one-dot chain line indicates the lower limit of the parasitic capacitance CD in the plate drive type ferroelectric memory, and the dotted line indicates the lower limit of the parasitic capacitance CD in the plate non-drive type ferroelectric memory. The solid line indicates the upper limit of the parasitic capacitance CD required for obtaining from the memory cell the read-out signal voltage which can be normally data-amplified by the sense amplifier. The hatched region indicates an operation range in which the plate drive type and the plate non-drive type can operate.

In summary, the conventional ferroelectric memories have a problem in which when the data is read out from the memory cell, the voltage of the data signal line varies, although the mechanism of the voltage variation is different from one operation system to another, and in some cases, the coercive voltage Vc required to invert the polarization is not applied between the opposing electrodes of the ferroelectric capacitor, with the result that a normal data reading cannot be performed.

SUMMARY OF THE INVENTION

Accordingly, it is an object of the present invention to provide a ferroelectric memory and a method for controlling an operation thereof, which has overcome the above mentioned defect of the conventional memories.

Another object of the present invention is to provide a ferroelectric memory and a method for controlling an operation thereof, capable of performing a stable operation, by obtaining a sufficient read-out signal voltage.

The above and other objects of the present invention are achieved in accordance with the present invention by a ferroelectric memory comprising, a plurality of pairs of data signal lines for outputting and receiving data, a plurality of selection signal lines selected in accordance with an address signal, and a plurality of unitary memory cell arrays each arranged along a corresponding one pair of data signal lines of the plurality of pairs of data signal lines, each of the unitary memory cell arrays including:

- a plurality of memory cells each including a ferroelectric capacitor having a capacitor dielectric composed of a ferroelectric material and sandwiched between a pair of opposing electrodes, a switching means connected to the ferroelectric capacitor and one of the corresponding pair of data signal lines, and controlled by a corresponding one of the selection signal lines, so that different polarized conditions of the ferroelectric capacitor correspond to different conditions of stored data, respectively, and when a first voltage, which is not zero, is applied between the opposing electrodes of the ferroelectric capacitor, since a current flowing between the ferroelectric capacitor and the corresponding data signal line is different depending upon the polarized condition of the ferroelectric capacitor, the current is detected or a voltage appearing on the corresponding pair of data signal lines due to the current is detected for the purpose of reading out the stored data;

- a means connected to the corresponding one pair of data signal lines, for detecting a current or voltage difference appearing between the corresponding pair of data signal lines; and

- a means connected to at least one of the corresponding pair of data signal lines, for temporarily controlling a parasitic capacitance of at least one of the corresponding pair of data signal lines to an optimum value, when data is read out from a memory cell, for the purpose of minimizing a variation of the voltage on the at least one of the corresponding pair of data signal lines caused by factors other than the current caused due to the polarization of the ferroelectric capacitor.

According to another aspect of the present invention, there is provided a method for controlling an operation of the above mentioned ferroelectric memory, the method performing reading of data from the memory cell to be read out, by setting the corresponding data signal line connected to the memory cell to be read out to a second voltage, by setting a plate line connected to the memory cell to be read out, to a third voltage which is different from the second voltage and also different from a voltage before the data reading operation, by setting the selection signal line connected to the memory cell to be read out to a voltage for selecting the memory cell to be read out, so that a voltage difference is caused to occur between the opposing electrodes of the ferroelectric capacitor, whereby a signal corresponding to the data stored in the memory cell to be read out is outputted to the corresponding data signal line.

With the above mentioned arrangement, the means for temporarily setting the parasitic capacitance of the data signal line to an optimum value is provided as a means for suppressing the voltage variation of the data signal line when data is read out from the memory cell, so that a voltage not smaller than the coercive voltage Vc is surely applied between the opposing electrodes of the ferroelectric capacitor. Thus, the ferroelectric memory can be stably operated.

The above and other objects, features and advantages of the present invention will be apparent from the following description of preferred embodiments of the invention with reference to the accompanying drawings.

DESCRIPTION OF THE PREFERRED EMBODIMENTS

Figure 17:
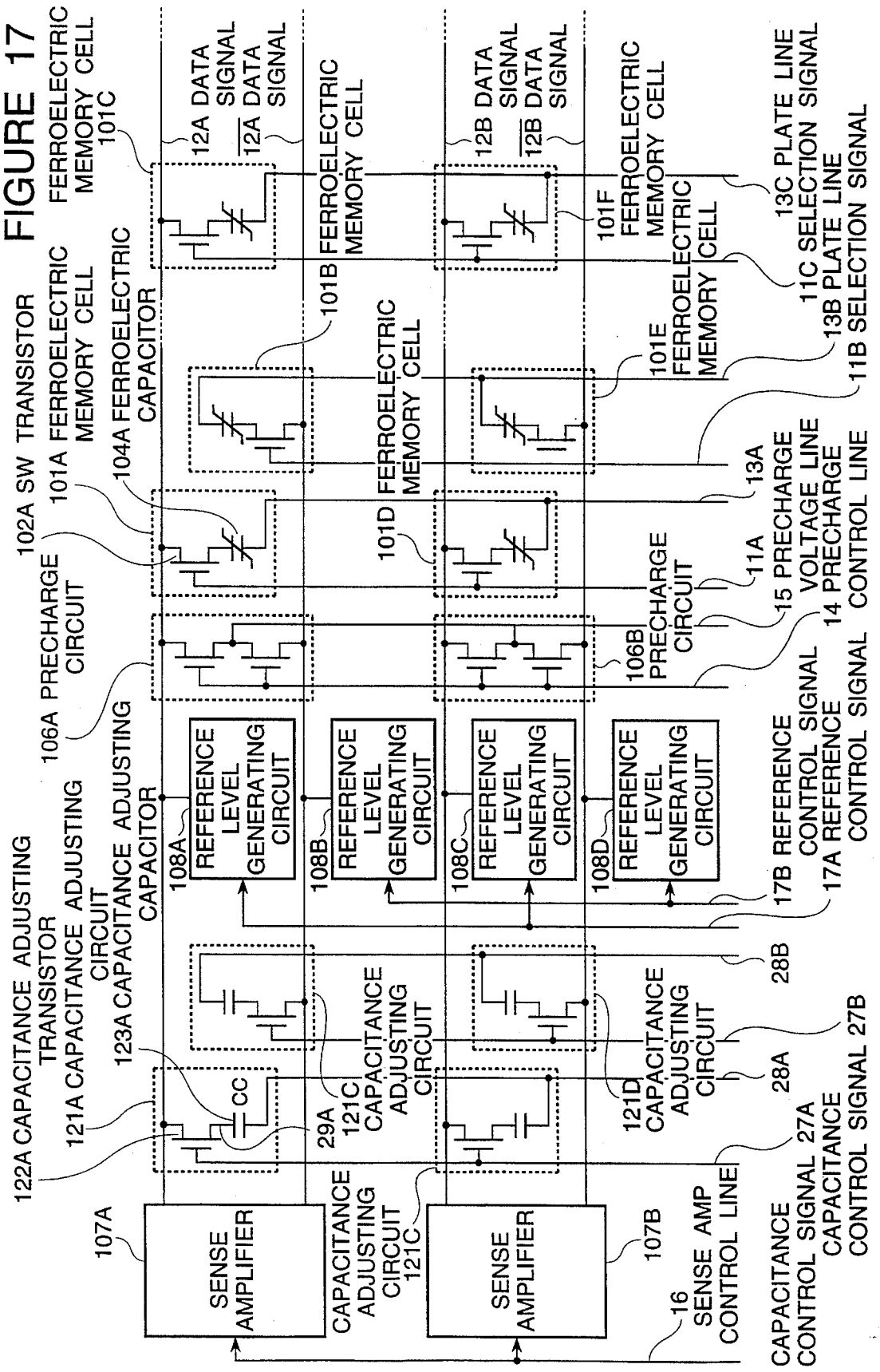
FIG. 17 is a circuit diagram of a first embodiment of the ferroelectric memory in accordance with the present invention, provided with a circuit composed of a transistor and a capacitor, for adjusting the data signal line parasitic capacitance.

Referring to FIG. 17, there is shown a circuit diagram of a first embodiment of the ferroelectric memory in accordance with the present invention, provided with a circuit composed of a transistor and a capacitor, for adjusting the data signal line parasitic capacitance. FIG. 17 illustrates an embodiment in which the present invention is applied to a ferroelectric memory composed of 1T/1C type memory cells and adopting the plate drive type data reading system.

As mentioned hereinbefore, in the case of the plate drive type data reading system, when the data is read out form the ferroelectric memory, it it necessary to fulfill the equation (5) or the equations (6) and (7) derived therefrom. In connection with this condition, the ferroelectric memory is so assumed that for example, the parasitic capacitance CS is 200 fF, the data signal line parasitic capacitance per one memory cell is 5 fF, the number of memory cells connected to one data signal line is "n", and the parasitic capacitance of the sense amplifier, the precharge circuit, etc. associated with the data signal line, excluding the memory cells, is 50 fF. Under this assumption, if the equation (7) is applied (accordingly, the condition of the operation voltage and others is in accordance with the equation (7)), the following relation must be fulfilled:

$$50\, fF + 5\, fF \times n \geqq 0.833 \cdots \times 200\, fF \tag{17}$$

As shown in FIG. 17, a data signal line capacitance adjusting circuit 121A composed of a data signal line capacitance adjusting transistor 122A and a data signal line capacitance adjusting capacitor 123A having a capacitance CC, is connected to the data signal line 12A. A gate of the transistor 122A is connected to a data signal line capacitance adjusting control signal line 27A, and a drain of the transistor 122A is connected to the data signal line 12A. A source of the transistor 122A is connected to one electrode of the data signal line capacitance adjusting capacitor 123A. The other electrode of the data signal line capacitance adjusting capacitor 123A is connected to an internal terminal line 28A of the data signal line capacitance adjusting circuit. Similar data signal line capacitance adjusting circuits 121B, 121C and 121D are connected to the data lines/12A, 12B and/12B, respectively.

With this arrangement, the equation (7) which must be fulfilled by the memory cell array when the data is read out from the memory cell, is changed as follows:

$$50\, fF + 5\, fF \times n + CC \geqq 0.833 \cdots \times 200\, fF \tag{18}$$

On the other hand, simultaneously, it is necessary to fulfil the condition equation (16), which means the condition that the signal voltage read out from the memory cell exceeds the minimum voltage which can be normally data-amplified by the sense amplifier.

Figure 6:
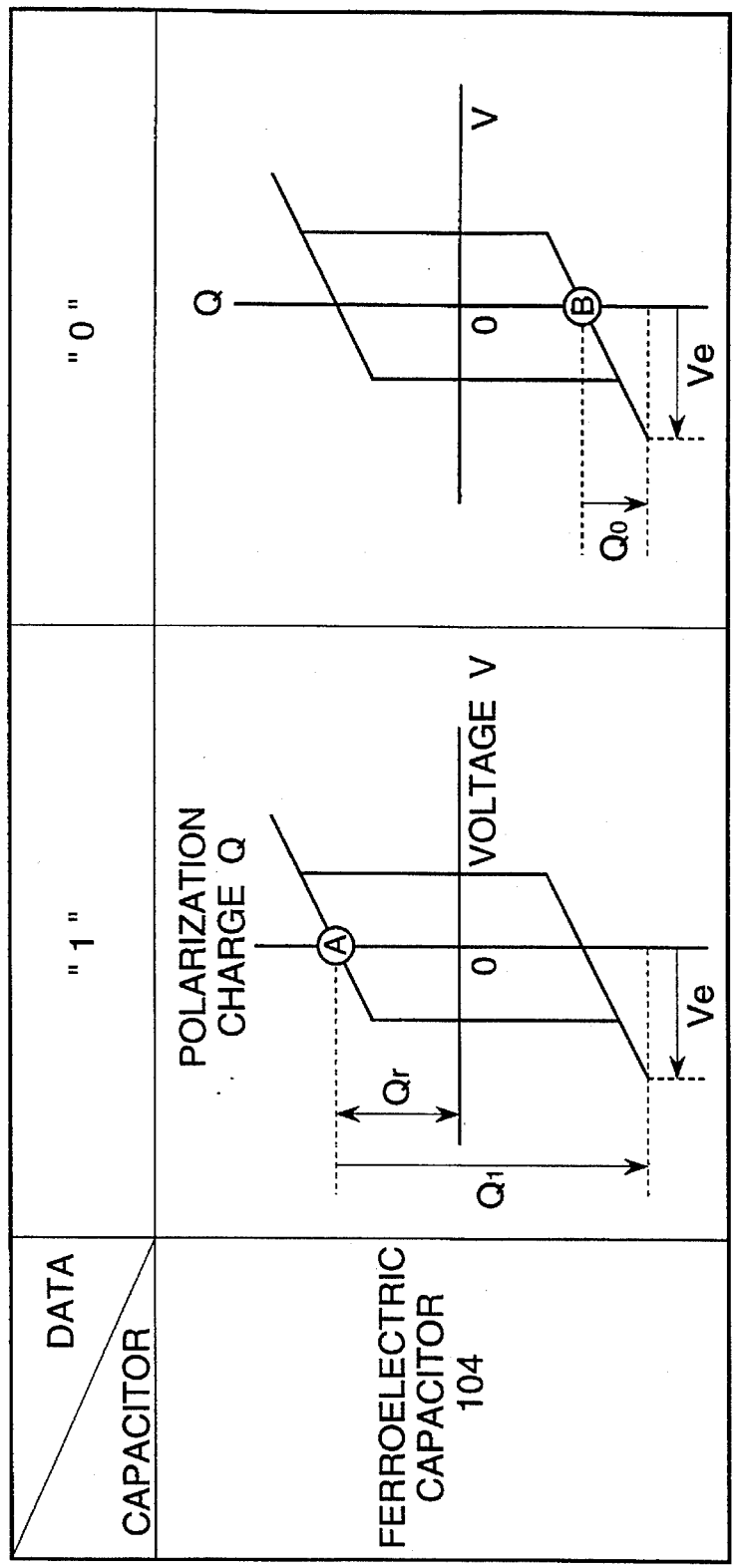
FIG. 6 illustrates a relationship between the spontaneous polarization electric charge and the voltage between opposing electrodes of the ferroelectric capacitor, in the ferroelectric memory cell of the type shown in FIG. 5.
Figure 7:
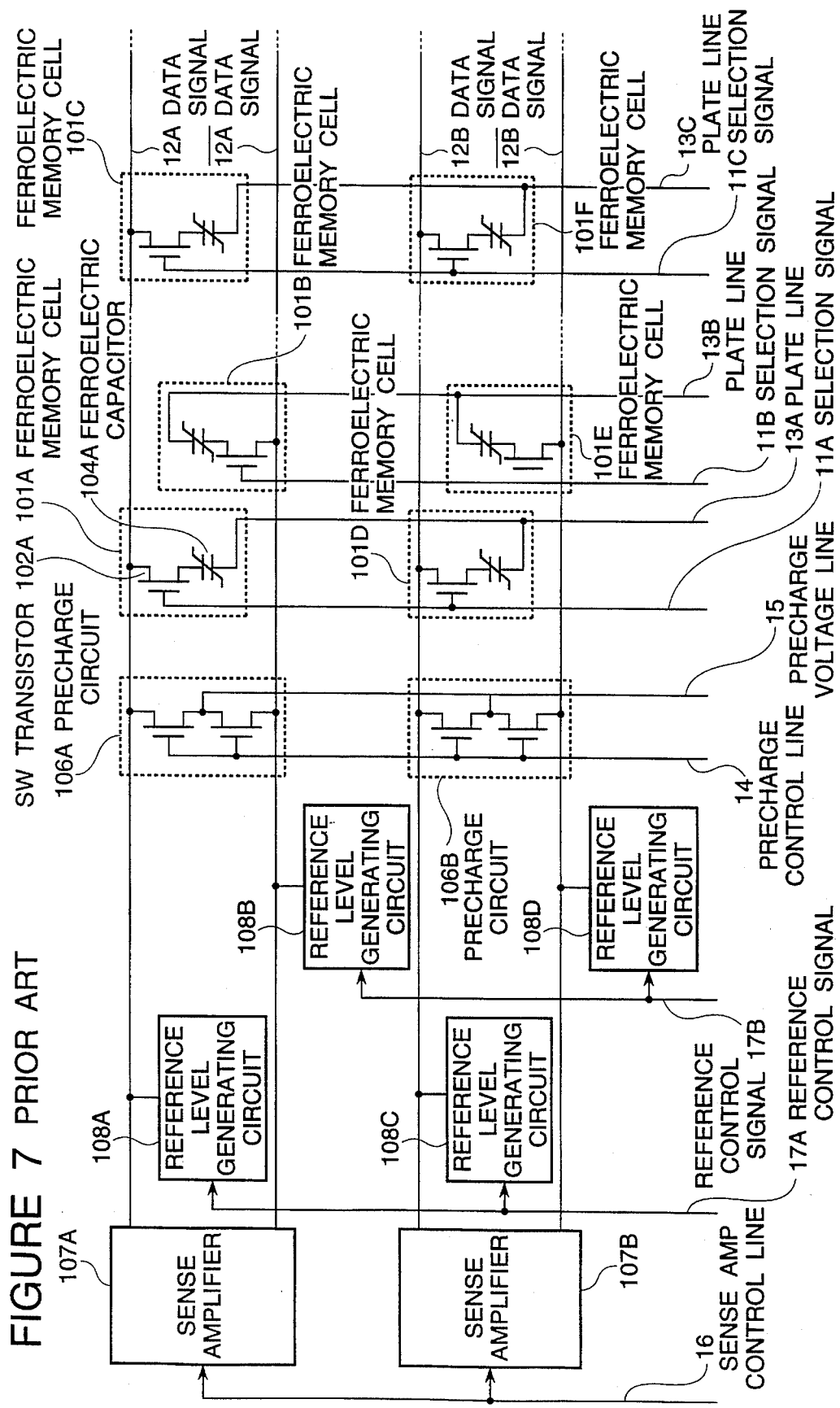
FIG. 7 is a partial circuit of a memory cell array in the ferroelectric memory using the memory cell of the type shown in FIG. 5.
Figure 8:
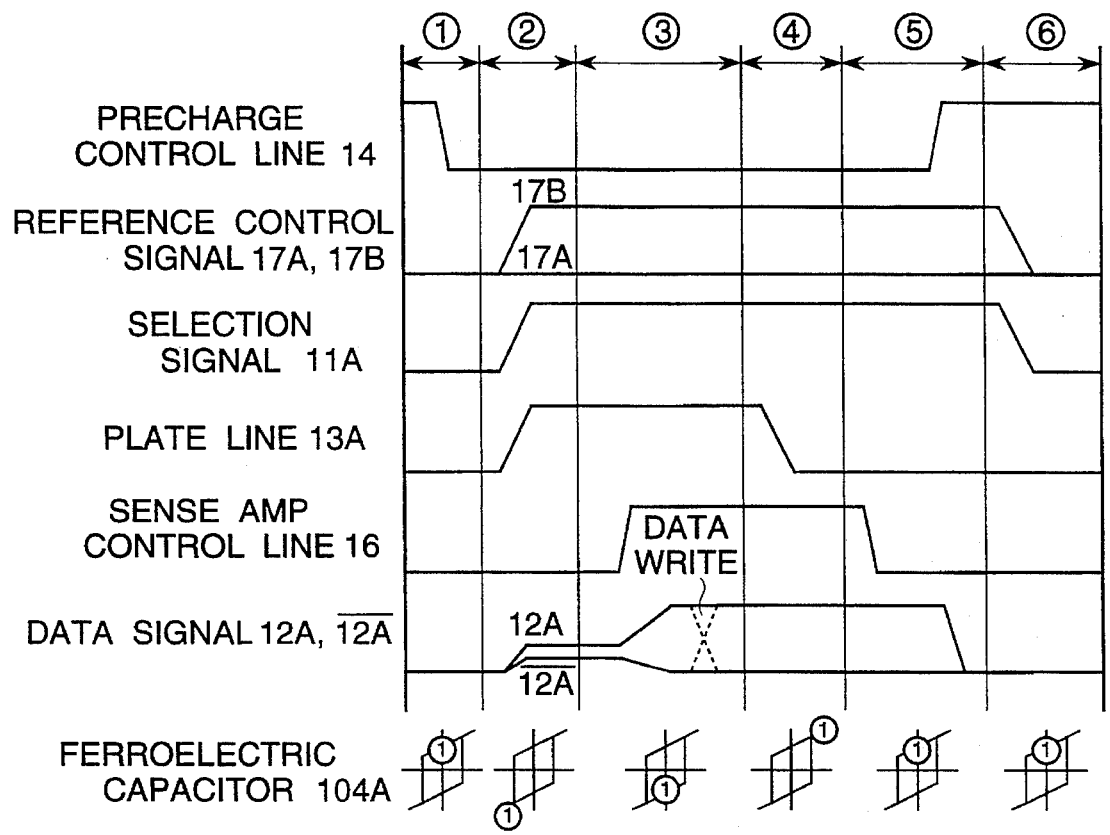
FIG. 8 is a timing chart illustrating an operation of the memory cell shown in FIG. 7.

This condition can be expressed as the following equation (19), by applying the equations (15) and (16) under the assumption that data signal line parasitic capacitance of the sense amplifier and each one memory cell and the CS value are the same used when the equation (18) is derived, and the minimum voltage which can be normally data-amplified by the sense amplifier, is 100 mV, and the ($Q_1-Q_0$) (in FIG. 6) of the 1T/1C memory cell is 1000 fC.

$$(\tfrac{1}{2}) \times 1000 \, fC/(50 \, fF + 5 \, fF \times n + CC + 200 \, fF) \geq 100 \, mV \quad (19)$$

Figure 1:
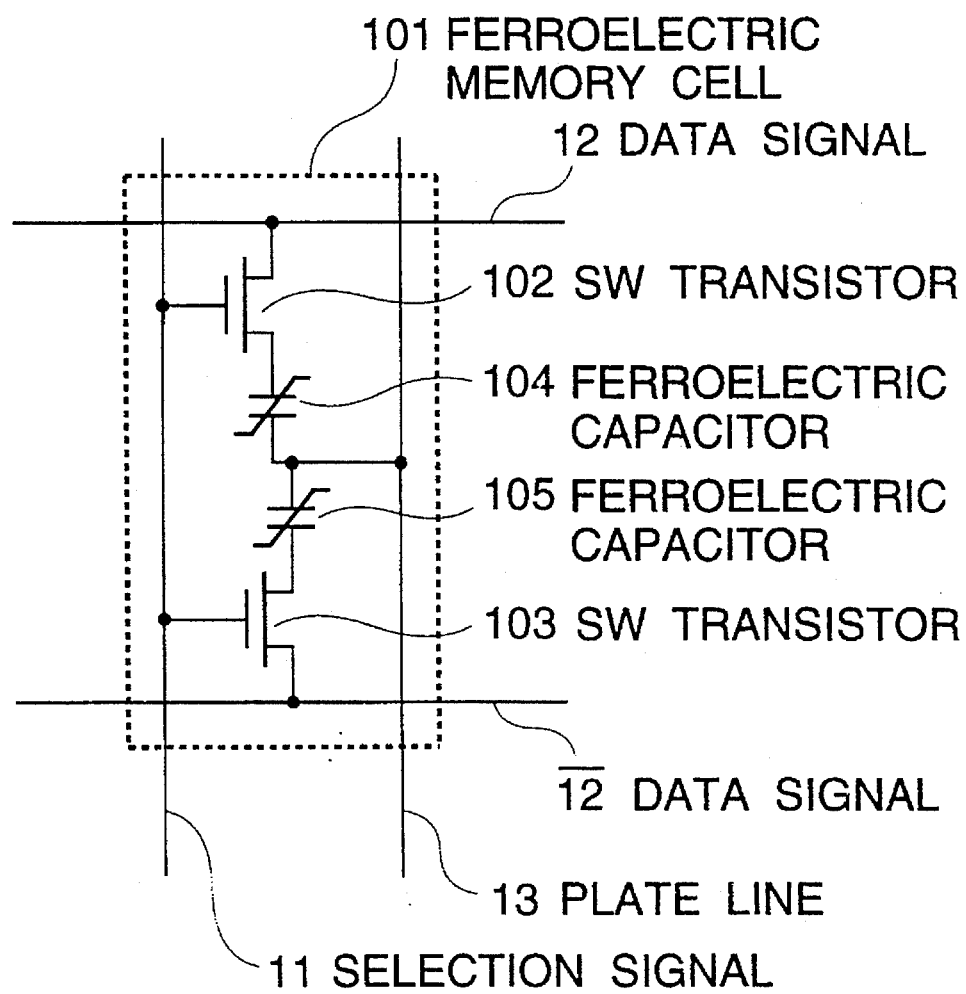
FIG. 1 a circuit diagram of the conventional ferroelectric memory cell constituted of two transistors and two ferroelectric capacitors.
Figure 2:
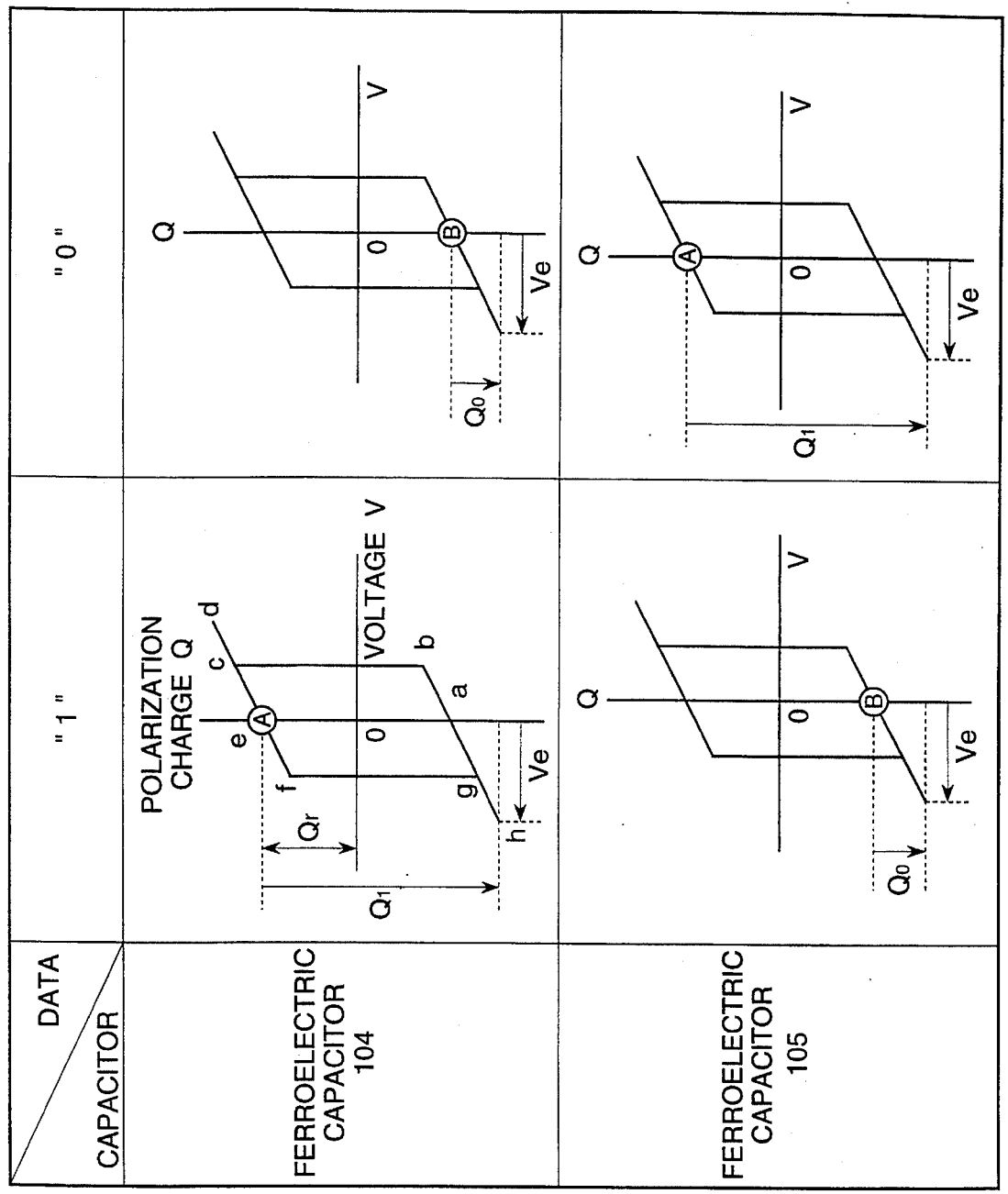
FIG. 2 illustrates a relationship between the spontaneous polarization electric charge and the voltage between opposing electrodes of the ferroelectric capacitor, in the ferroelectric memory cell of the type shown in FIG. 1.
Figure 3:
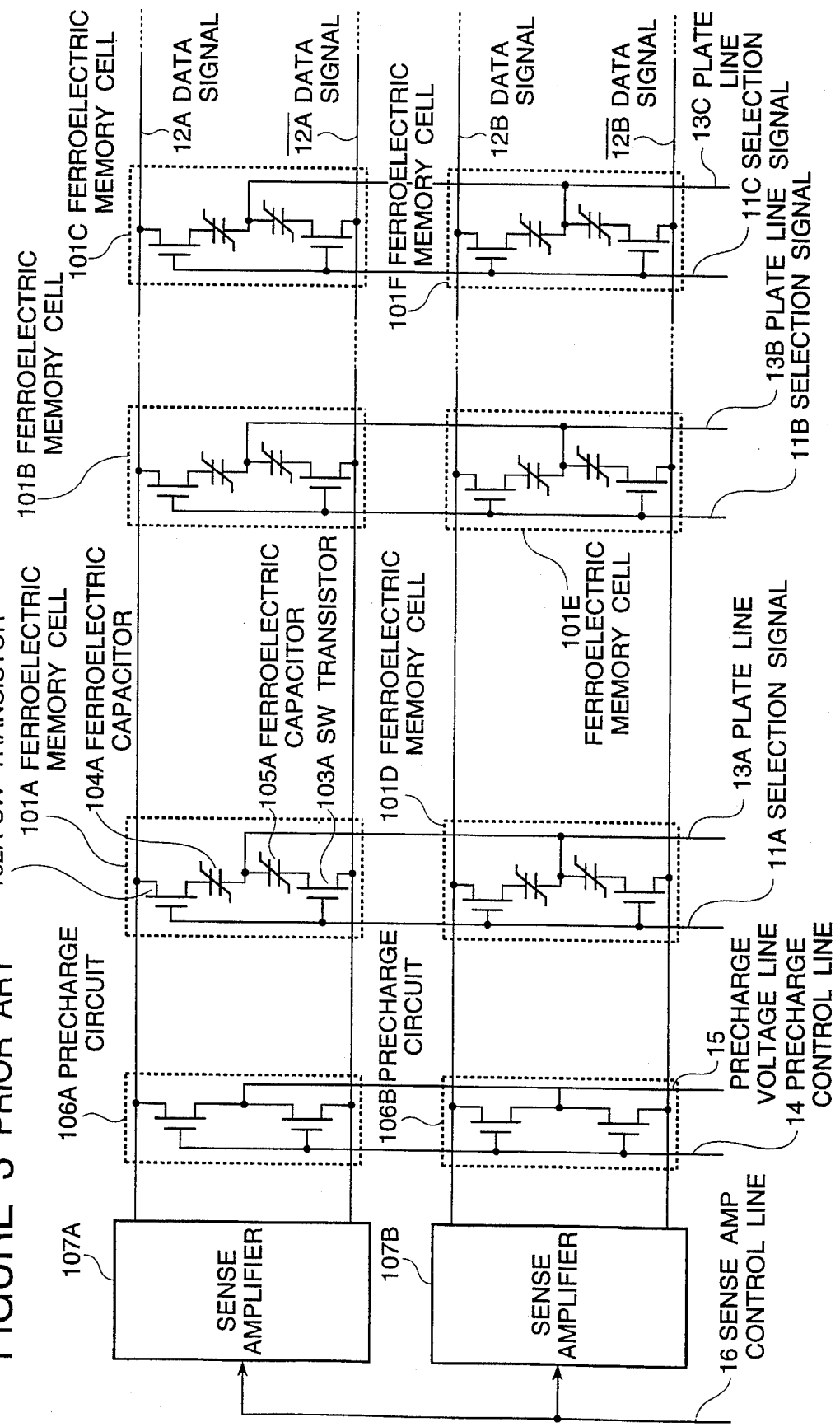
FIG. 3 is a partial circuit of a memory cell array in the ferroelectric memory using the memory cell of the type shown in FIG. 1.
Figure 4:
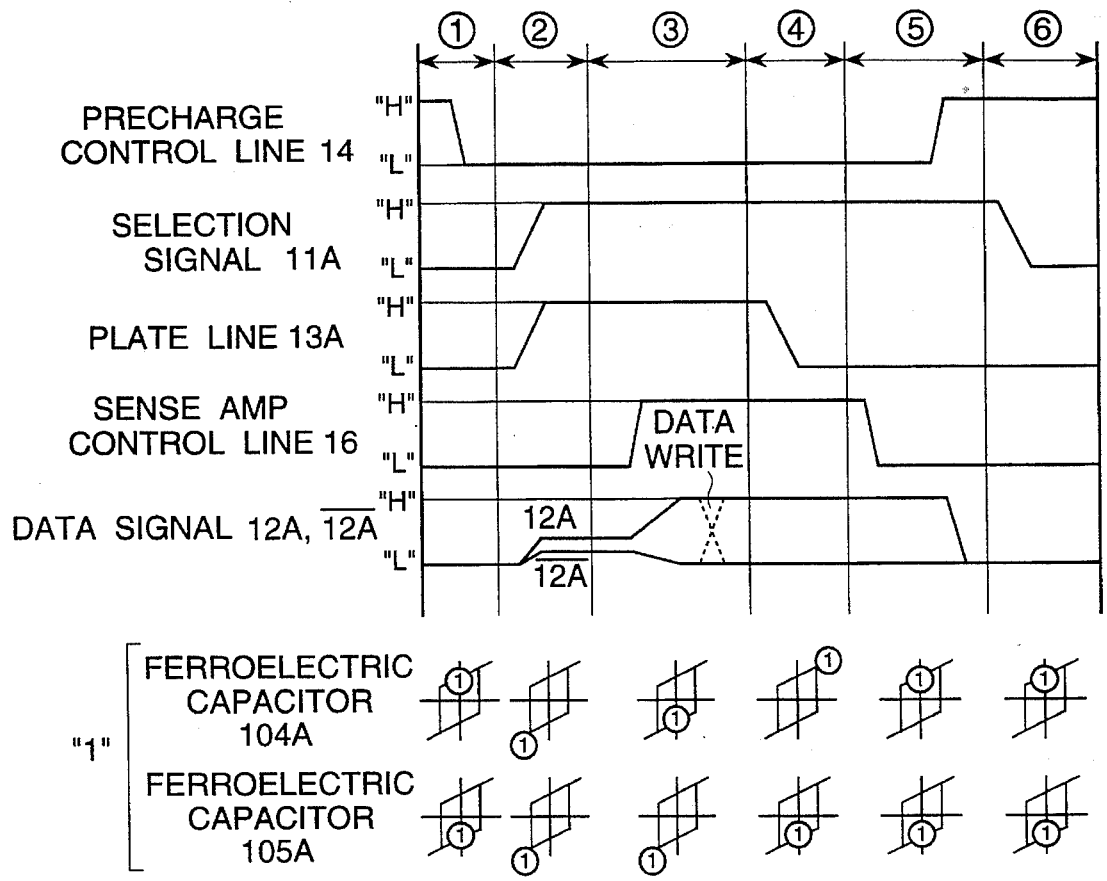
FIG. 4 is a timing chart illustrating an operation of the memory cell shown in FIG. 3.
Figure 5:
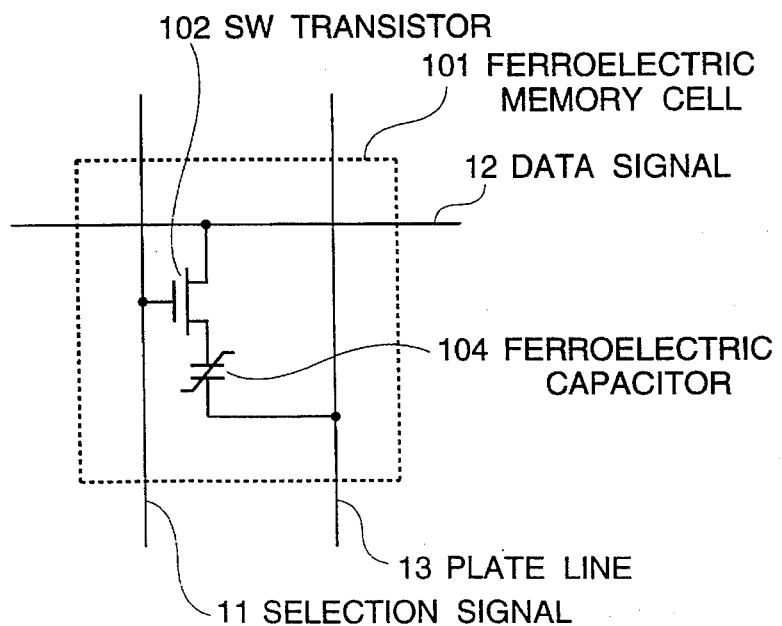
FIG. 5 a circuit diagram of the conventional ferroelectric memory cell constituted of one transistor and one ferroelectric capacitor.

In the case of the 2T/2C type memory cell, assuming that the ($Q_1-Q_0$) (in FIG. 2) is 1000 fC, and by applying the equations (14) and (16) the equation becomes the following equation (20) in which the first time ($\tfrac{1}{2}$) of the left side of the equation (19) is omitted:

$$1000 \, fC/(50 \, fF + 5 \, fF \times n + CC + 200 \, fF) \geq 100 \, mV \quad (20)$$

In the above mentioned construction, it is become possible to fulfil both the equation (18) and the equation (19) or (20) by adjusting the value of CC to a suitable value, independently of parameters such as the data signal line parasitic capacitance of the sense amplifier, the data signal line parasitic capacitance of the memory cell part, CS, etc.

Figure 18:
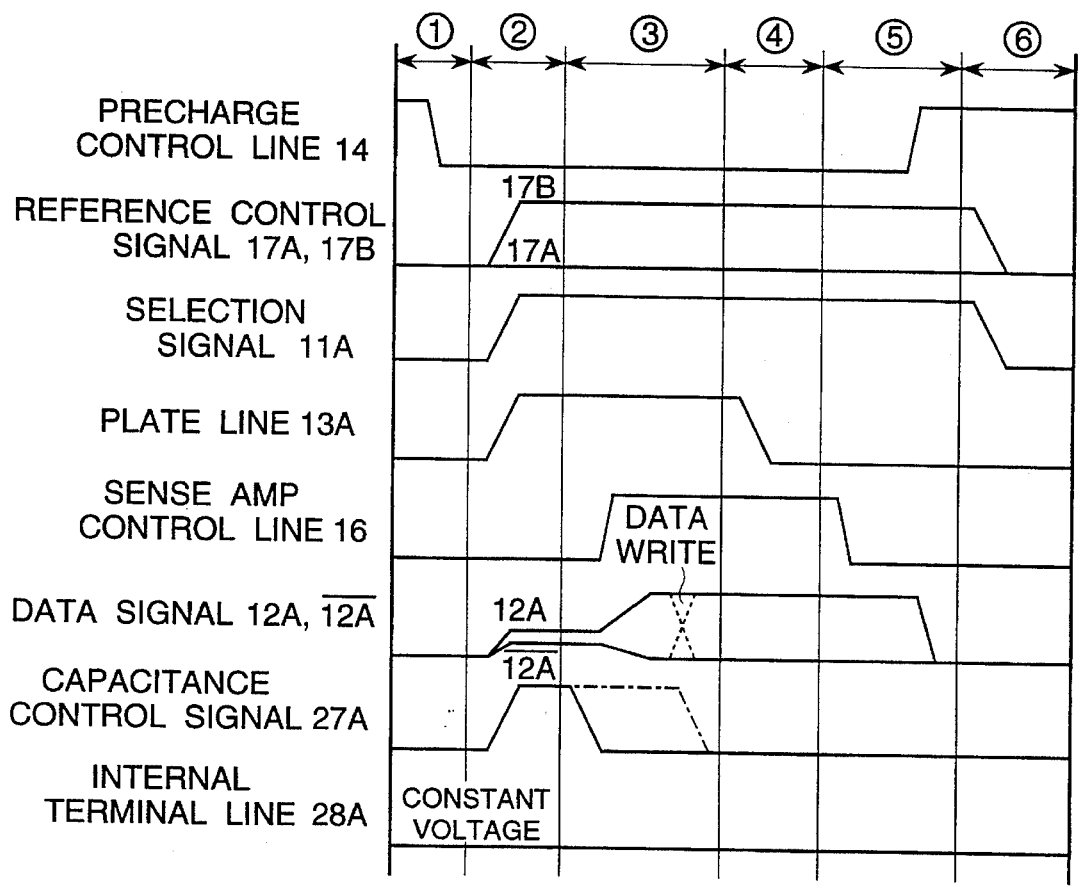
FIG. 18 is a timing chart illustrating an operation of the memory shown in FIG. 17.

Referring to FIG. 18, there is shown a timing chart of an operation of the ferroelectric memory shown in FIG. 17. Now, an operation of the memory cell 101 A will be described.

First, when data is read from the memory cell 101A, at the same time as the selection line 11A and the plate line 13A are brought to the high level, the data signal line capacitance adjusting control signal line 27A is brought to the high level, so that the capacitance CC is added to the data signal line 12A. Since the overall parasitic capacitance of the data signal line 12A is set to fulfil the equations (18) and (19) when capacitance CC is added, a sufficient voltage is applied between the opposing electrodes of the ferroelectric capacitor 104A, and therefore, it is ensured to obtain a sufficient read-out signal voltage which can normally sense-amplified by the sense amplifier.

The rising timing of the data signal line capacitance adjusting control signal line 27A may be prior to the rising timing of the selection line 11A and the plate line 13A. In addition, the falling timing of the data signal line capacitance adjusting control signal line 27A may be before, during or after the sense amplifier is in an activated condition, namely at any timing during a period from the falling timing shown by the solid line in FIG. 18 to the falling timing shown by the chain line. In particular, if the data signal line capacitance adjusting control signal line 27A has fallen before the sense amplifier is activated (as shown by the solid line in FIG. 18), when the sense amplifier is in an activated condition, the capacitance CC is not added to the data signal line, so that a charge/discharge based on an extra capacitance does not occur. Therefore, the operation speed can be increased, and the consumed electric power can be reduced.

The other operation is the same as that of the conventional example explained hereinbefore.

As mentioned above, according to the present invention, since it is possible to freely set various components of the data signal line parasitic capacitance excluding the capacitance CC, it is possible to ensure a sufficient signal voltage read out from the memory cell. In addition, by deactivating the adjusting circuit 121A after the data is read from the memory cell and before the sense amplifier is activated, so as to separate the capacitance CC from the data signal line, it is possible to shorten the sense amplifying time in the reading operation. Furthermore, when the data supplied from an external of the memory is written into the memory cell, it is not necessary to fulfil the equations (4) and (5). Therefore, by previously deactivating the adjusting circuit 121A, an unnecessary charge/discharge of the capacitance CC is eliminated. Therefore, in this situation, the operation speed can be increased, and the consumed electric power can be reduced.

Figure 19:
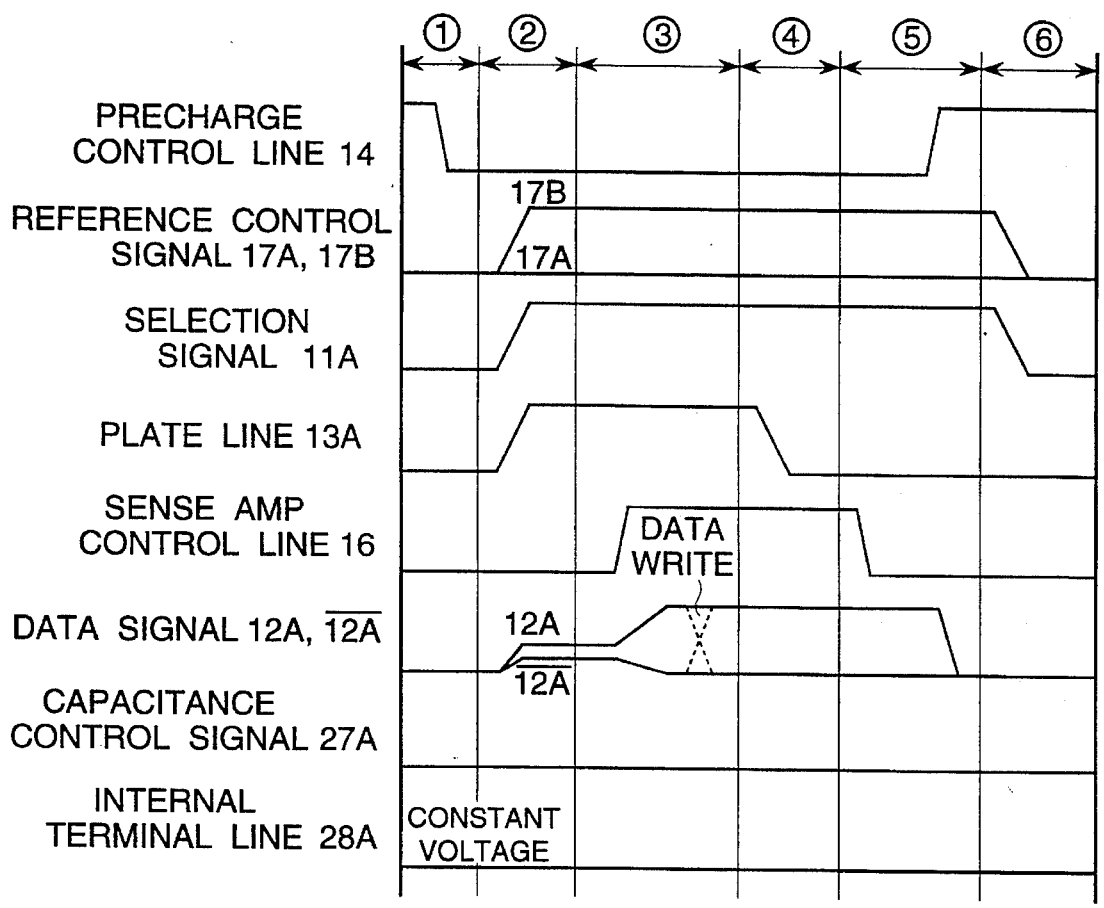
FIG. 19 is a timing chart illustrating a data writing operation of the memory cell shown in FIG. 17, which is a second embodiment of the present invention.

An example of the operation timing chart in such a writing operation is shown in FIG. 19 as a second embodiment of the present invention. The control signal line 27A is maintained at the low level, and a voltage corresponding to the data to be written is set onto the data signal line 12A during a period (3). Thus, data is written into the ferroelectric memory cell 101A.

In the embodiment shown in FIG. 19, data is read from the ferroelectric memory cell 101A during the period (2). In this case, there is the possibility that the equations (4) and (5) are not fulfilled in connection with the parasitic capacitance of the data signal line. Therefore, there is the possibility that the read-out data is not consistent with the data stored in the memory cell. However, since this operation is the data writing mode, this inconsistency is no problem.

Figure 20:
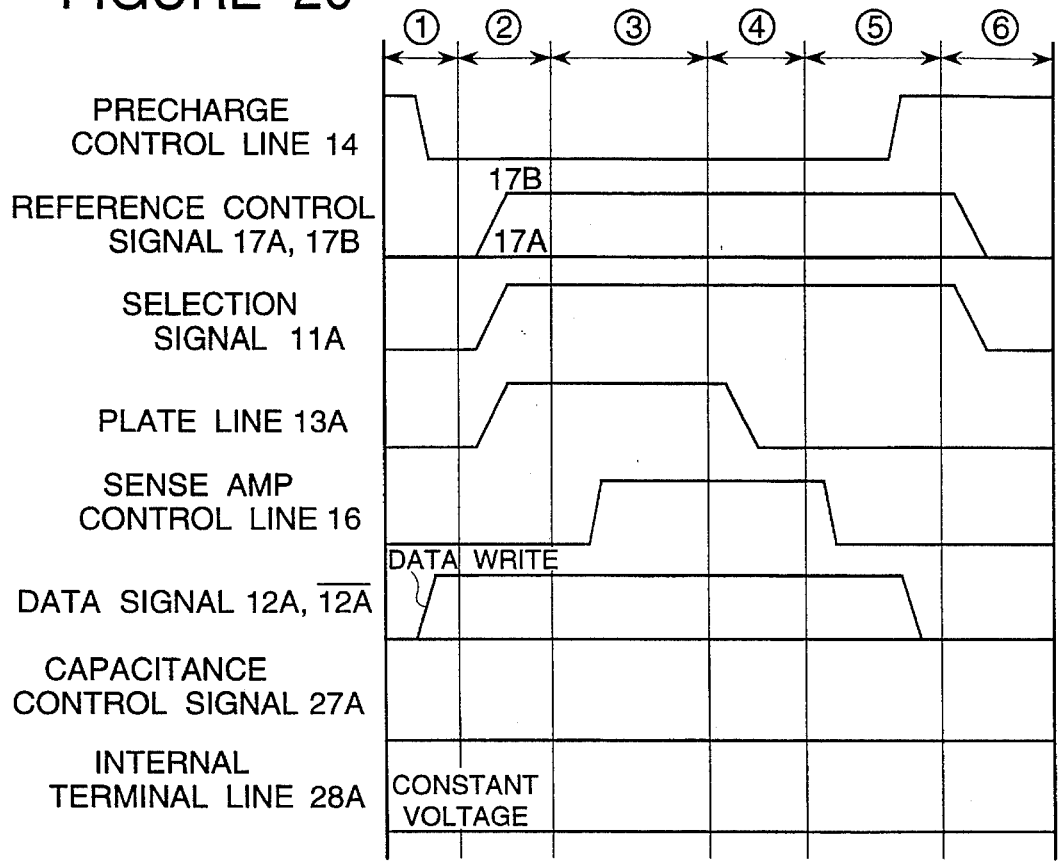
FIG. 20 is a timing chart illustrating a data writing operation of the memory cell shown in FIG. 17, which is a third embodiment of the present invention.

If the data to be written is previously known, it is possible to previously set a voltage corresponding to the data to be written, onto the data signal line 12A, as shown in FIG. 20, which illustrates the third embodiment of the present invention. In the embodiment shown in FIG. 20, the control signal line 27A is maintained at the low level.

Incidentally, it is possible to use the ferroelectric capacitor of the memory cell as the data signal line capacitance adjusting capacitor 123A. In addition, it is possible to use the memory cell itself as the data signal line capacitance adjusting circuits 121A to 121D. In some case, it is possible to connect a plurality of adjusting circuits to one data signal line.

Figure 21:
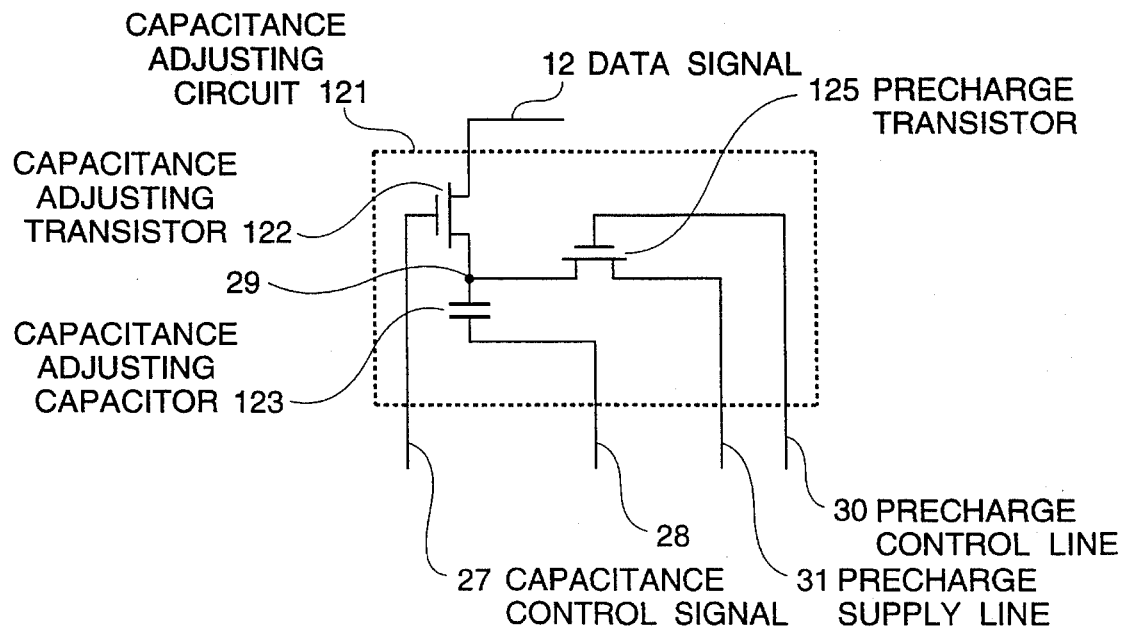
FIG. 21 is a circuit diagram of a fourth embodiment of the ferroelectric memory in accordance with the present invention, in which a precharge transistor is connected to a circuit composed of a transistor and a capacitor, for adjusting the data signal line parasitic capacitance.
Figure 22:
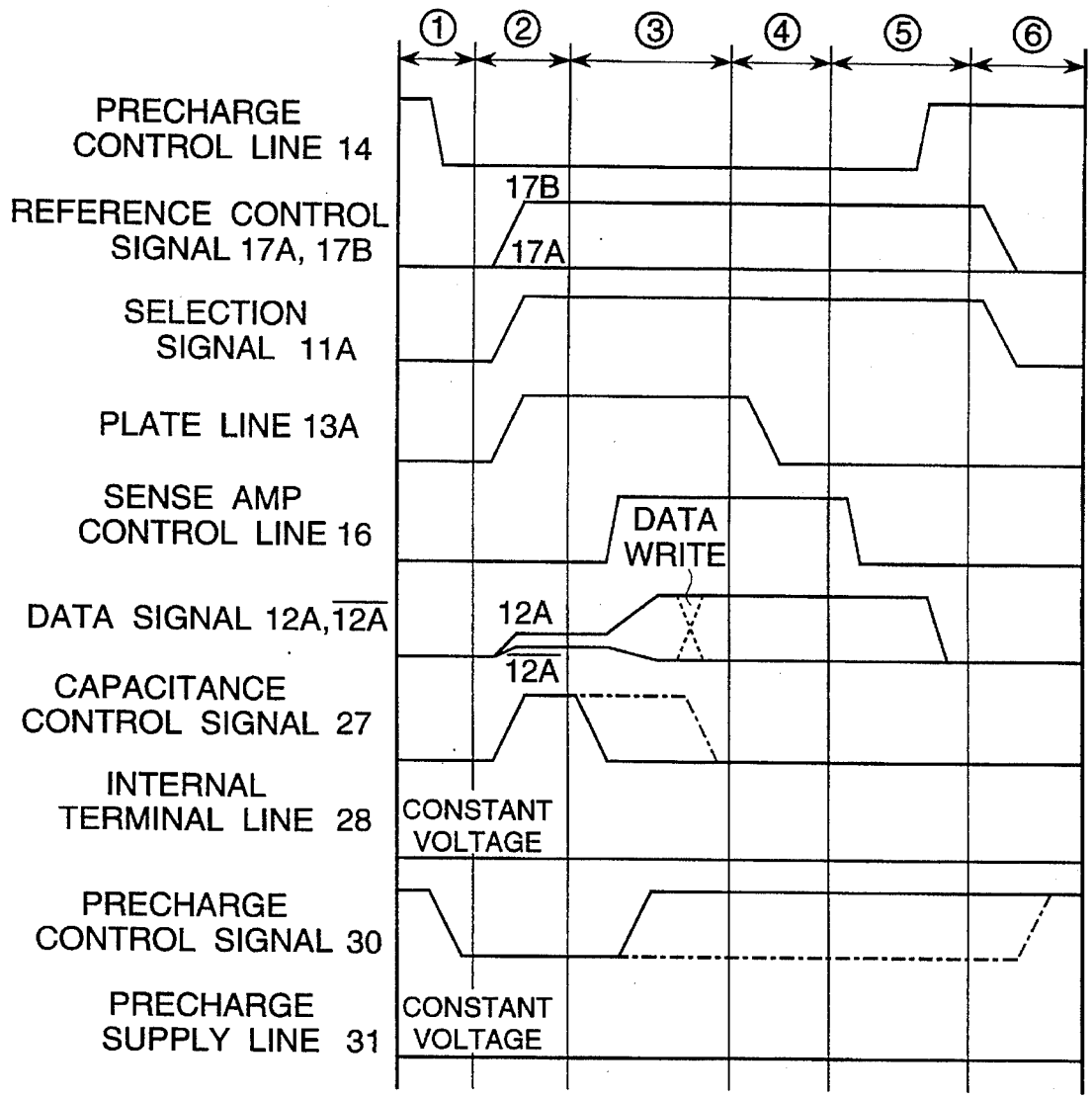
FIG. 22 is a timing chart illustrating a data writing operation of the memory shown in FIG. 1 to which the circuit shown in FIG. 21 is applied.

In the adjusting circuit shown in FIG. 17, a node 29A interconnecting the data signal line capacitance adjusting transistor 122A and the data signal line capacitance adjusting capacitor 123A is in a floating condition when the control signal line 27A is at the low level. In this situation, a transistor 125 can be added which has a drain connected to the node 29, a source connected to the signal line 31 and a gate connected to the control line 30, as shown in FIG. 21 which illustrates a circuit diagram of a fifth embodiment of the present invention. In addition, FIG. 22 shows a timing chart in which the adjusting circuit 121 shown in FIG. 21 is incorporated into the memory cell array shown in FIG. 17. When the control signal line 27 in FIG. 21 is not activated, the data signal line capacitance adjusting circuit precharge control signal line 30 is brought to the high level, so that the voltage on the node 29 in the data signal line capacitance adjusting circuit is brought to the voltage supplied from the data signal line capacitance adjusting circuit precharge power supply line 31, in order to present an indefinite electric charge from appearing to the data signal line 12 from the node 29 when the control signal line 27 is brought to the high level. It is sufficient if the falling timing of the control signal line 30 is prior to the rising timing of the control signal line 27, and it is sufficient if the rising timing of the control signal line 30 is prior to the falling timing of the control signal line 27.

It is a matter of course that it is possible to adopt the writing system shown in FIGS. 19 and 20 in the memory using the circuit shown in FIG. 21.

Figure 11:
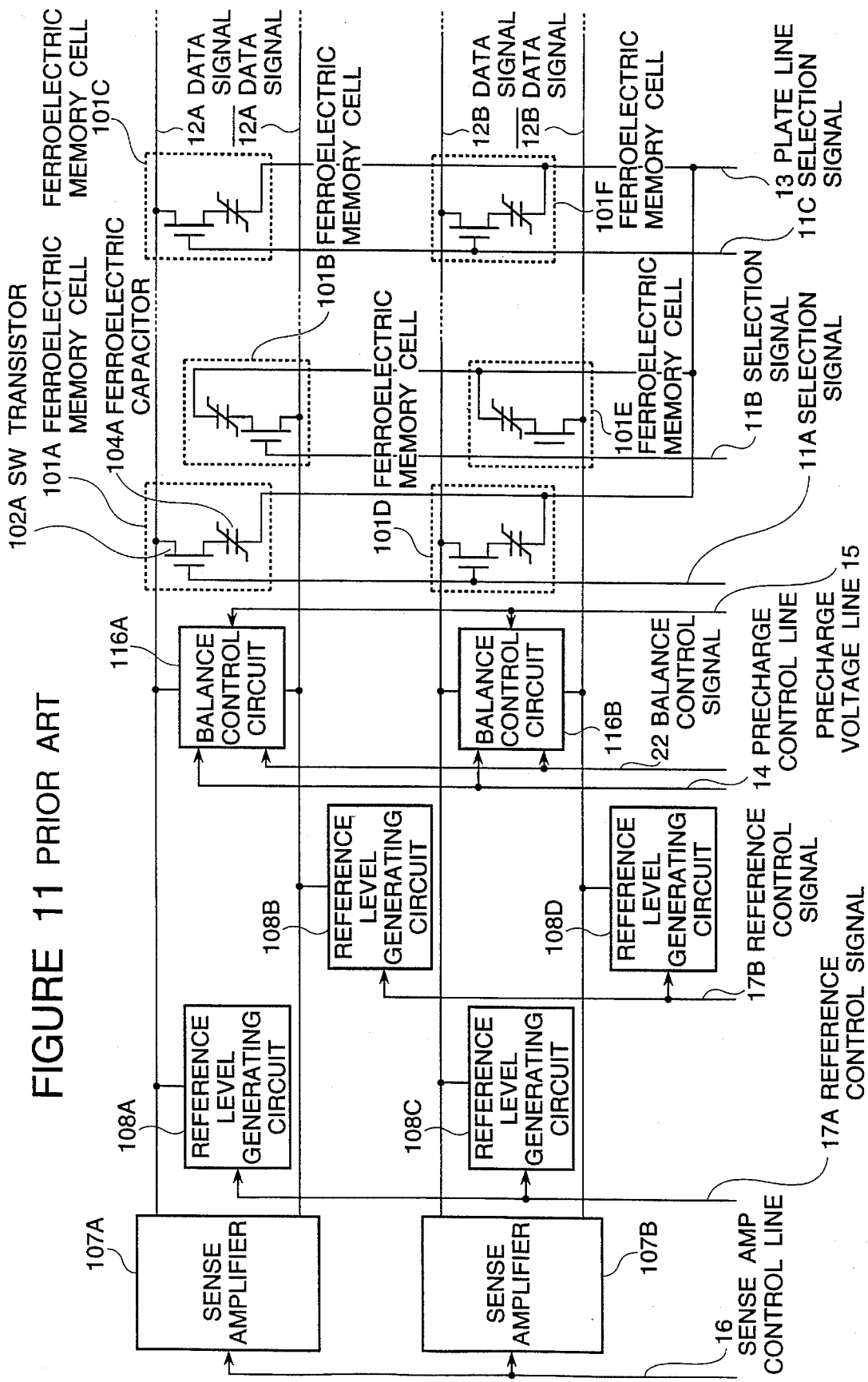
FIG. 11 is a partial circuit of a memory cell array in the plate non-drive type ferroelectric memory.
Figure 12:
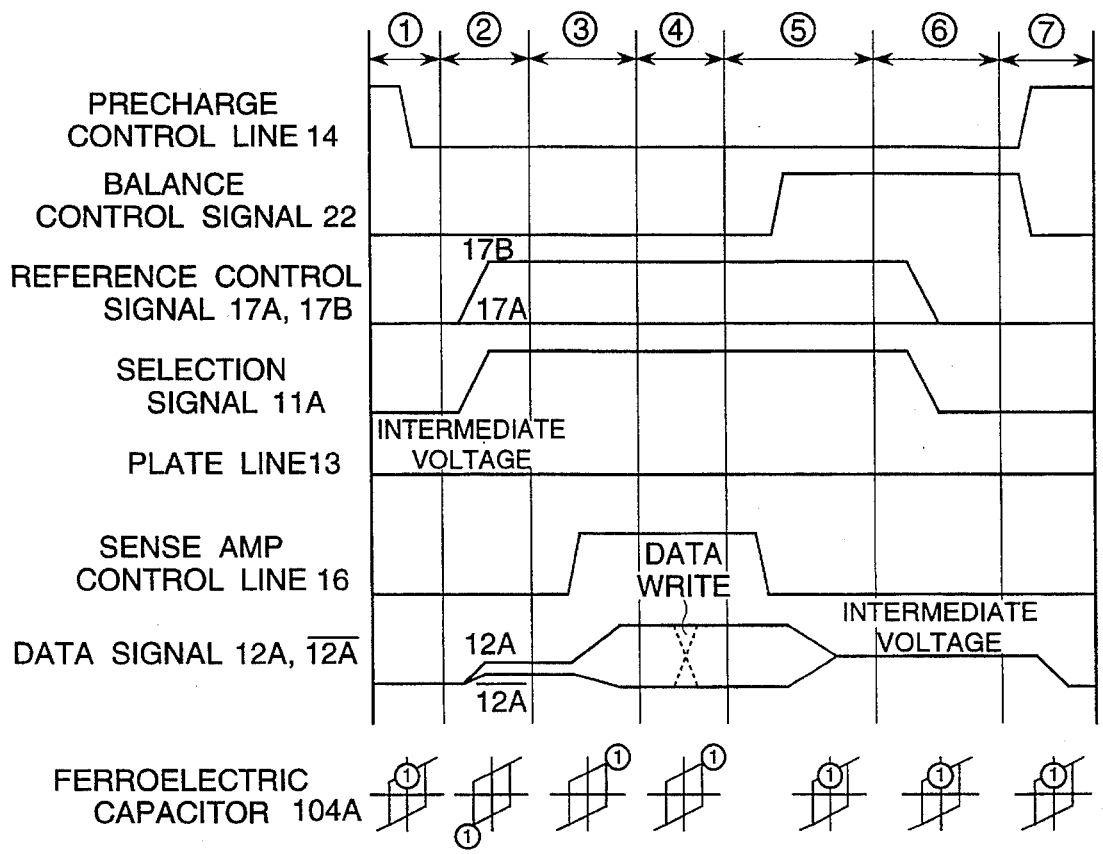
FIG. 12 is a timing chart illustrating an operation of the memory cell shown in FIG. 11.
Figure 13:
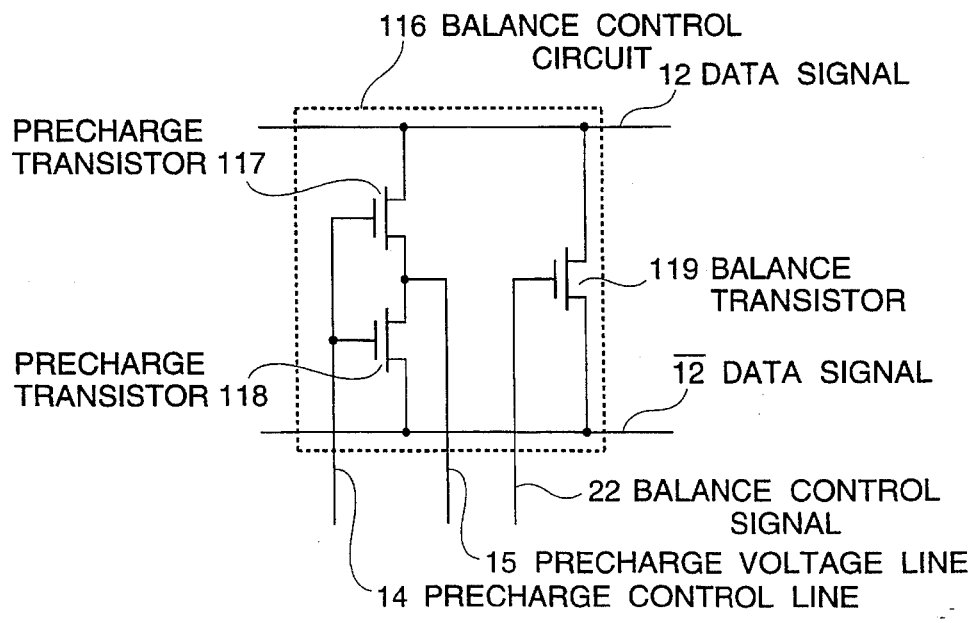
FIG. 13 is a circuit diagram of a specific circuit of the data signal line precharge balance control circuit.
Figure 14:
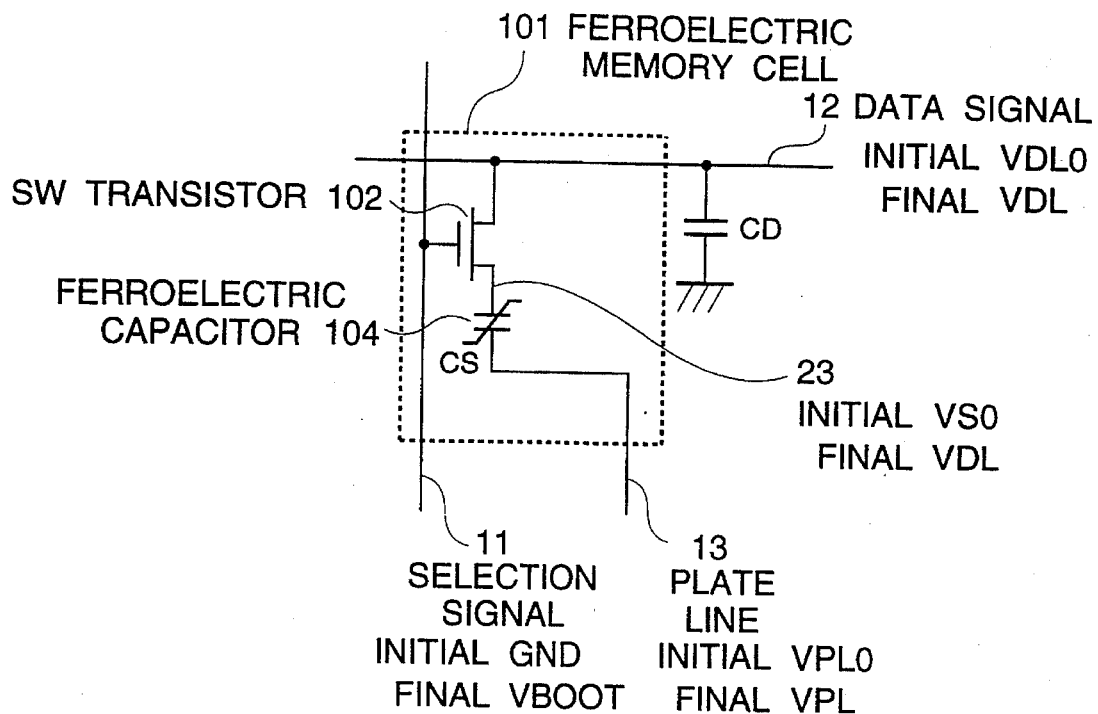
FIG. 14 is a circuit diagram for illustrating the voltage variation of the data signal line when the data is read out from the memory cell in the plate drive type ferroelectric memory.
Figure 15:
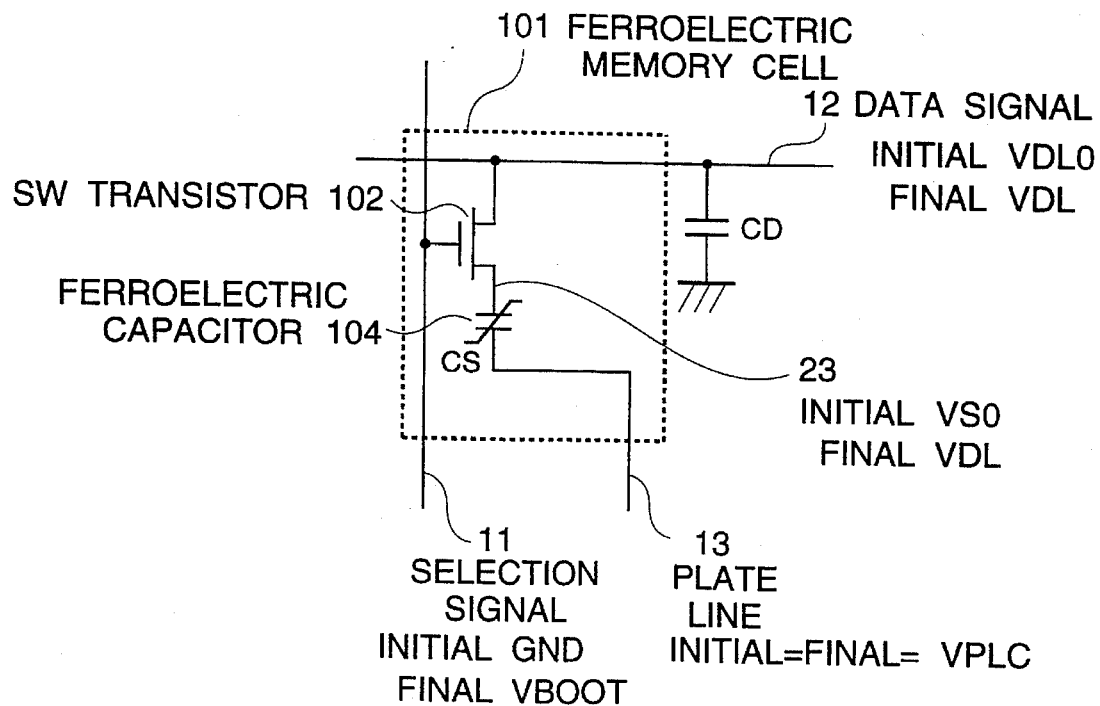
FIG. 15 is a circuit diagram for illustrating the voltage variation of the data signal line when the data is read out from the memory cell in the plate non-drive type ferroelectric memory.
Figure 16:
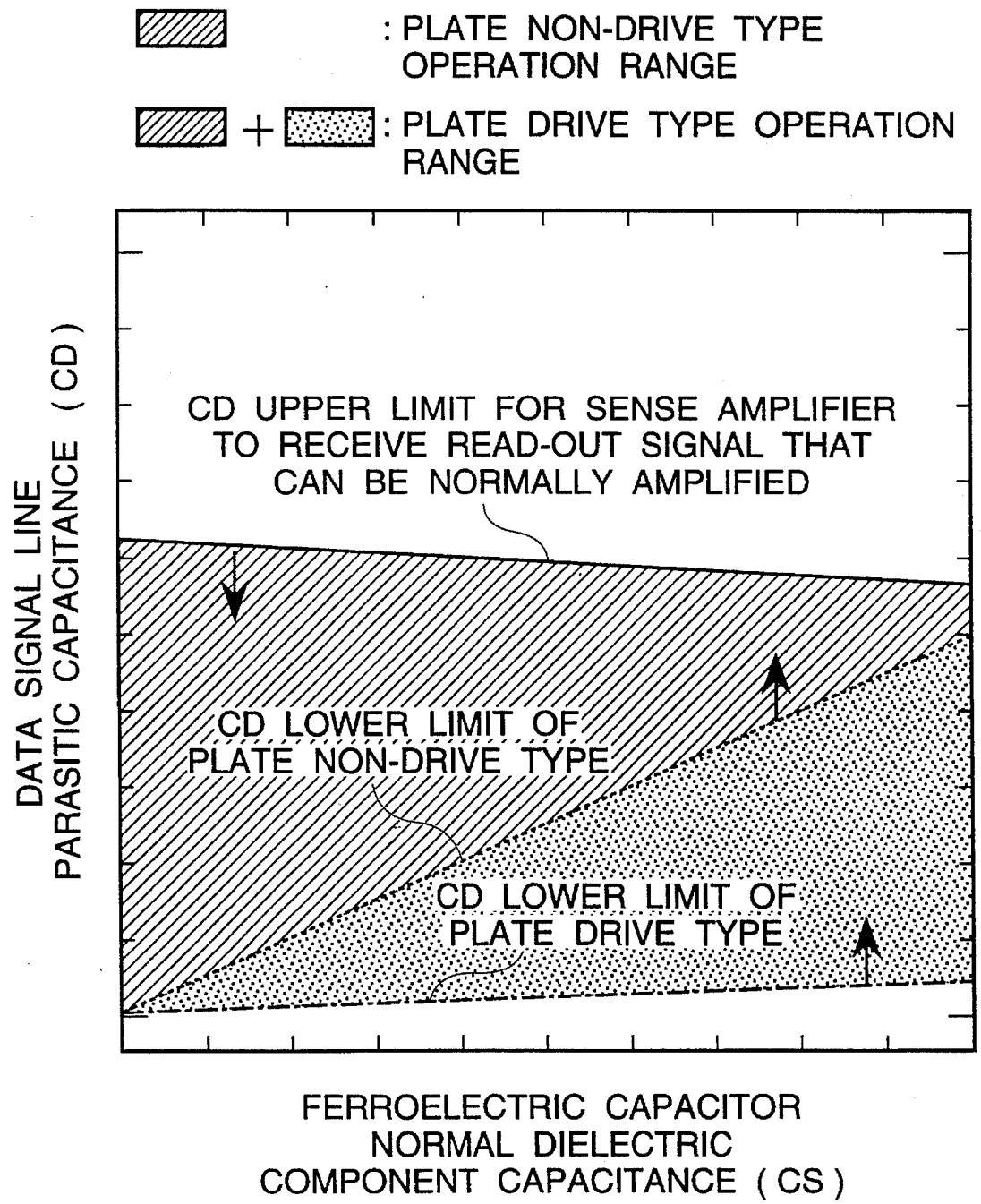
FIG. 16 illustrates a relationship between the data signal line parasitic capacitance and the normal dielectric capacitance of the ferroelectric capacitor, and an operation range of the ferroelectric memory.
Figure 23:
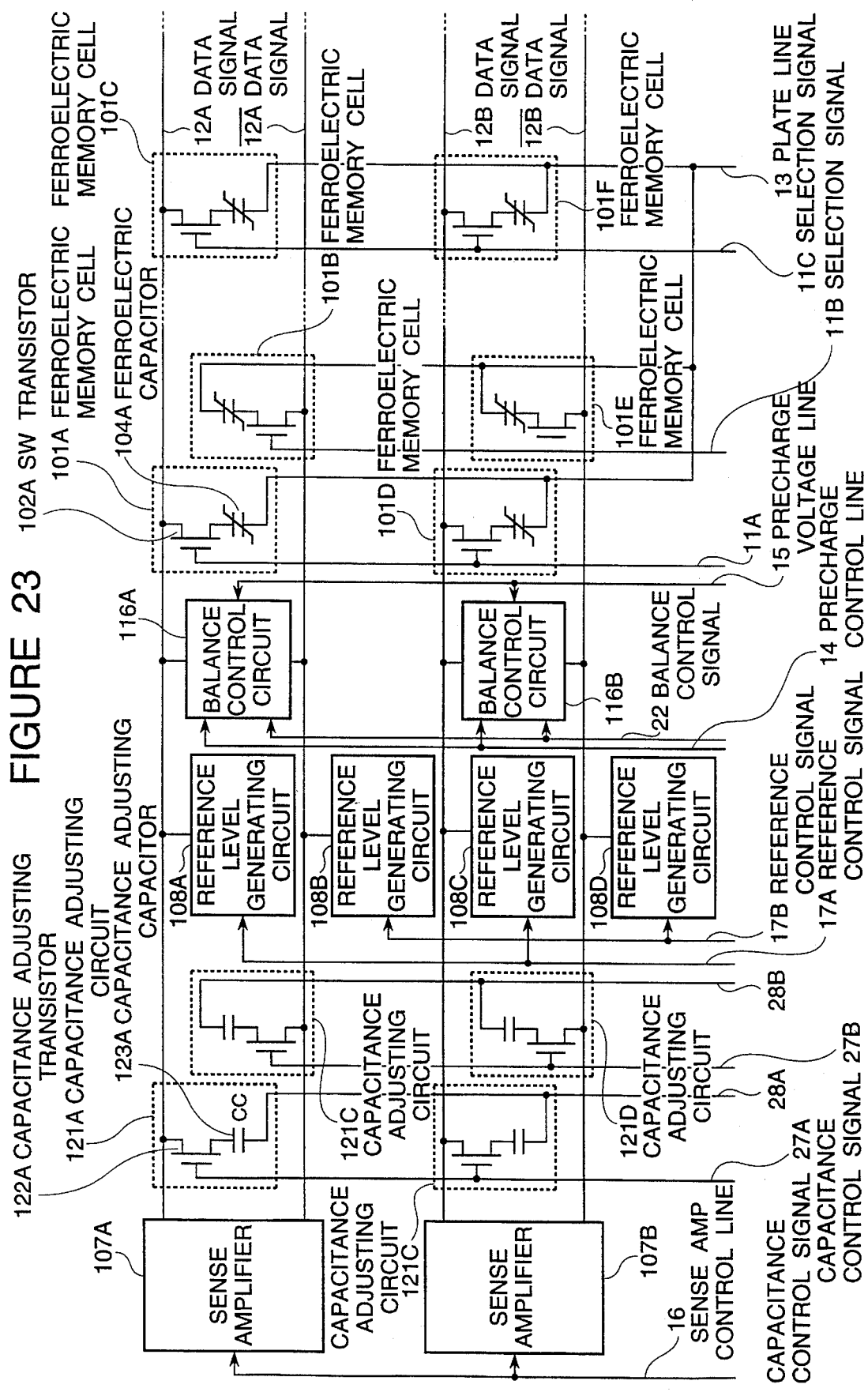
FIG. 23 is a circuit diagram of a fifth embodiment of the ferroelectric memory in accordance with the present invention, provided with a circuit composed of a transistor and a capacitor, for adjusting the data signal line parasitic capacitance.

FIG. 23 is a circuit diagram of a fifth embodiment of the ferroelectric memory in accordance with the present invention, which is composed of 1T/1C memory cells as shown in FIGS. 11 and 12, and which adopts the plate non-drive type data reading system.

As mentioned hereinbefore, in the case of the plate non-drive type data reading system, it it necessary to fulfil the equation (10) or (11) or the equations (12) and (13) derived therefrom. In connection with this condition, it is assumed that the ferroelectric memory has device parameters including the parasitic capacitance CS, the data signal line parasitic capacitance per memory cell, the number of memory cells connected to one data signal line, and the parasitic capacitance of the sense amplifier, the precharge circuit, etc. associated with the data signal line, excluding the memory cells, are the same as those in the plate drive type as mentioned above. Under this assumption, if the equation (13) is applied (accordingly, the condition of the operation voltage and others is in accordance with the equation (13)), the following relation must be fulfilled:

$$50\ fF + 5\ fF \times n \geq 10 \times 200\ fF \tag{21}$$

In the embodiment shown in FIG. 23, a data signal line capacitance adjusting circuit 121A composed of a data signal line capacitance adjusting transistor 122A and a data signal line capacitance adjusting capacitance 123A having a capacitance CC, similarly to FIG. 17, is connected to the data signal line 12A.

With this arrangement, the equation (21) is changed as follows:

$$50\ fF + 5\ fF \times n + CC \geq 10 \times 200\ fF \tag{22}$$

On the other hand, if the minimum voltage which can be normally data-amplified by the sense amplifier and the value of $(Q_1 - Q_0)$ are the same as the above mentioned plate drive type, the condition equation that the signal voltage read out from the memory cell exceeds the minimum voltage which can be normally data-amplified by the sense amplifier, becomes the equation (19) in the case of the 1T/1C memory cell and the equation (20) in the case of the 2T/2C memory cell.

In the above mentioned construction of the plate non-drive type, it is become possible to fulfil both the equation (22) and the equation (19) or (20) by adjusting the value of CC to a suitable value, independently of parameters such as the data signal line parasitic capacitance of the sense amplifier, the data signal line parasitic capacitance of the memory cell part, CS, etc.

Figure 24:
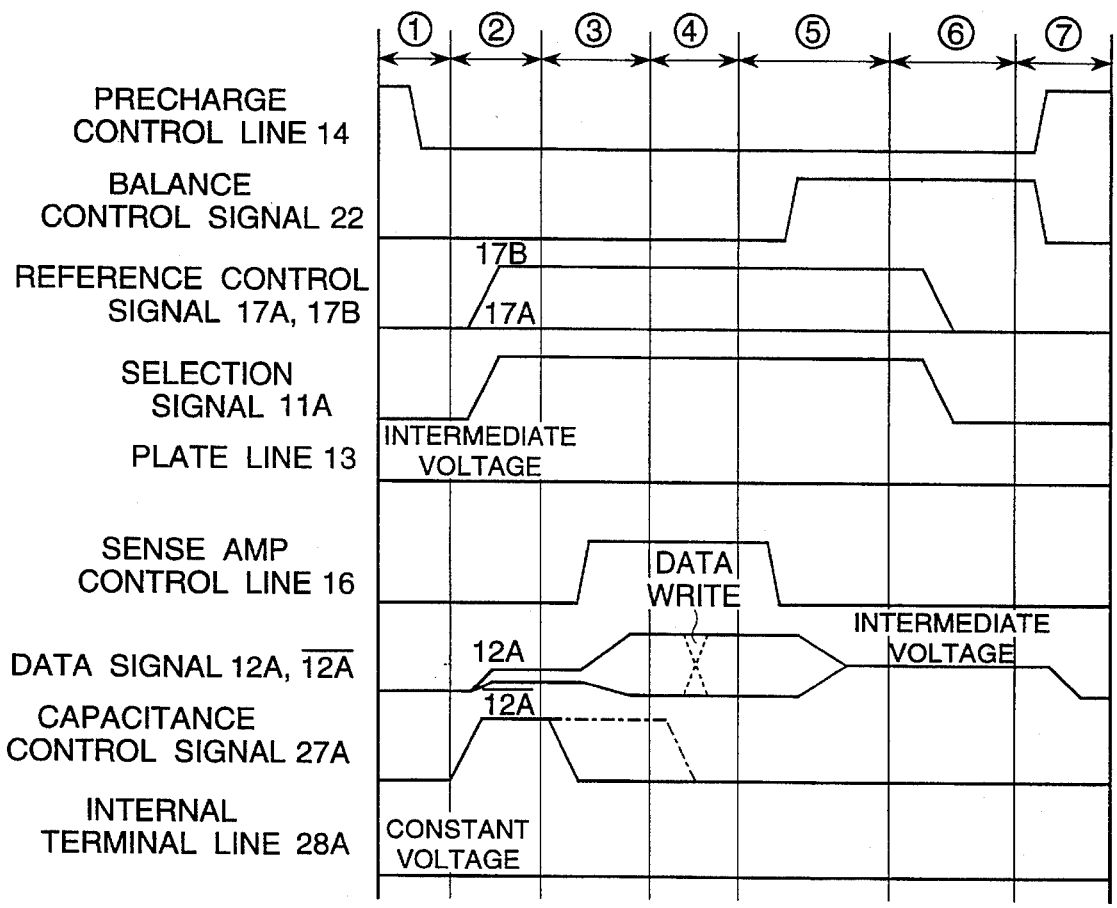
FIG. 24 is a timing chart illustrating an operation of the memory shown in FIG. 23.

Referring to FIG. 24, there is shown a timing chart of an operation of the ferroelectric memory shown in FIG. 23. The operation of the data signal line capacitance adjusting circuit 121A, the data signal line capacitance adjusting control signal line 27A and the internal capacitor terminal line 28B of the data signal line capacitance adjusting circuit, is the same as that shown in FIG. 18. The other operation is the same as shown in FIG. 12. In addition, in the ferroelectric memory adopting the plate non-drive type operation system, the data writing method explained with reference to FIGS. 19 and 20, can be applied similarly, and also the circuit shown in FIG. 21 and the operation method shown in FIG. 22 can be applied similarly.

Figure 25:
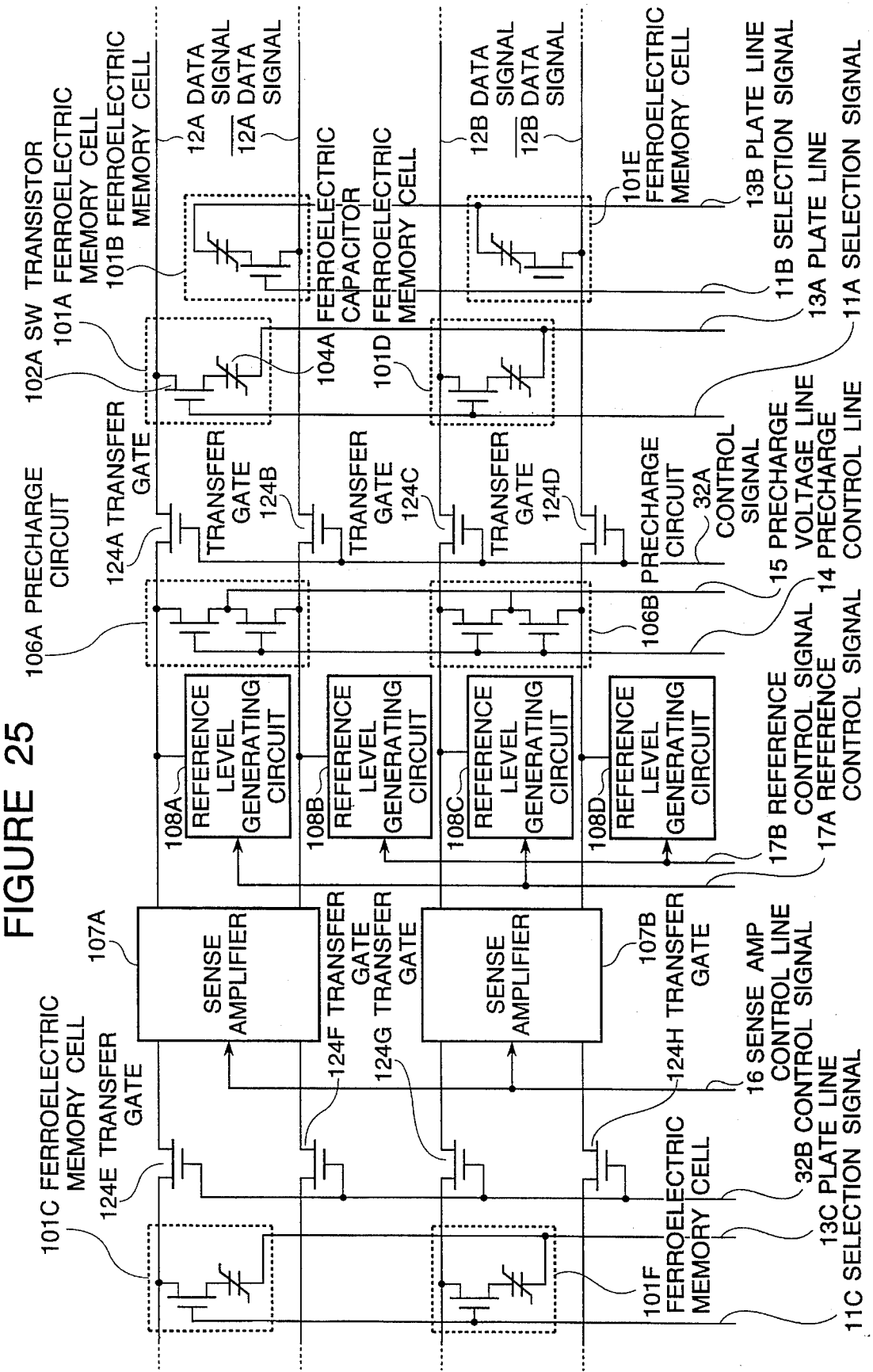
FIG. 25 is a circuit diagram of a sixth embodiment of the ferroelectric memory in accordance with the present invention, configured to adjust the data signal line parasitic capacitance by connecting a plurality of data signal lines.

Referring to FIG. 25, there is shown a circuit diagram of a sixth embodiment of the ferroelectric memory in accordance with the present invention, configured to adjust the data signal line parasitic capacitance in the data reading operation, by adding a plurality of data signal line connecting transfer gates 124A to 124H in the plate drive type ferroelectric memory, so as to connect a plurality of data signal lines to one another.

In the above mentioned embodiments, the circuit composed of the transistor and the capacitor is added to the data signal lines, in order to adjust the capacitance CD. From a different viewpoint, in order to adjust the data signal line parasitic capacitance CD in the data reading operation, the sixth embodiment is configured to prepare a group of data lines (data sub-lines), to interconnect the group of data lines by transfer gates, and to control the on-off of the transfer gates.

Figure 26:
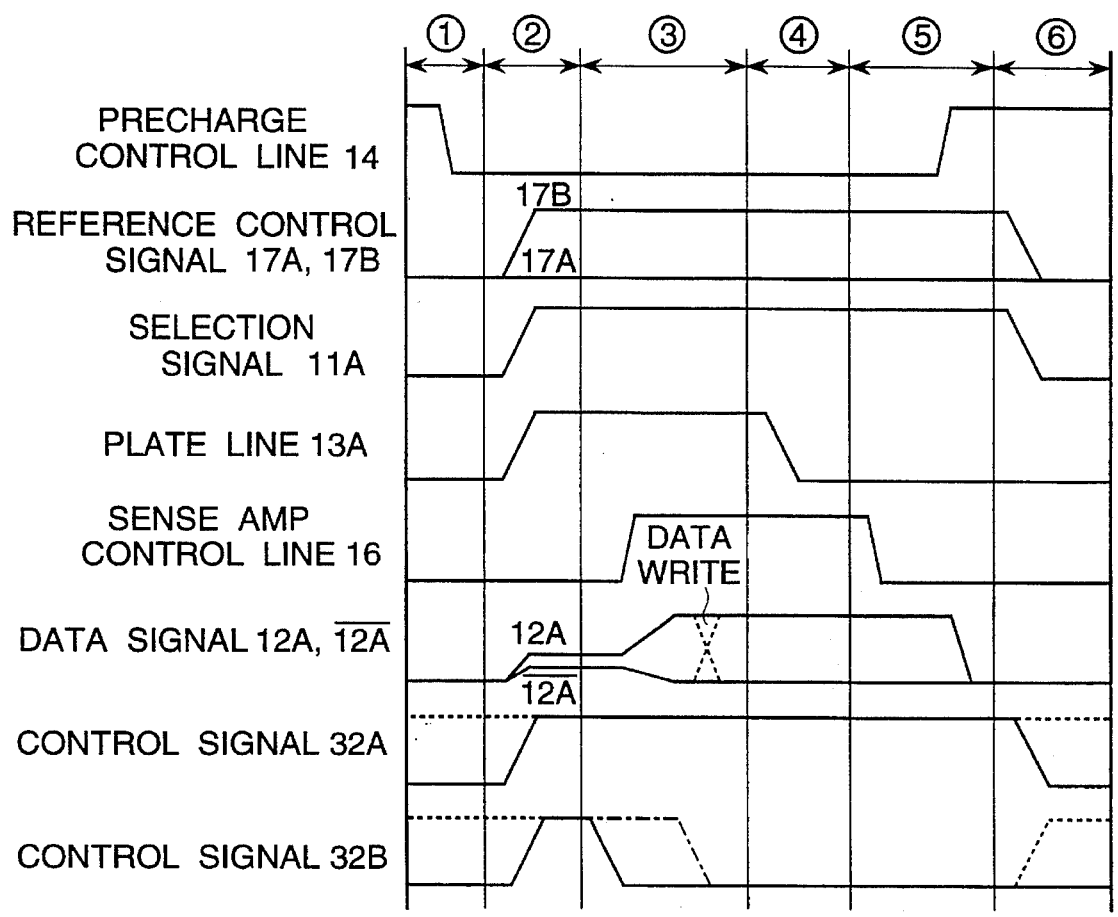
FIG. 26 is a timing chart illustrating an operation of the memory shown in FIG. 25.

Referring to FIG. 26, there is shown a timing chart illustrating an operation of the memory shown in FIG. 25.

A mutual connection of the data signal sub-lines (constituting one data signal line 12A, for example) is controlled by controlling control signal lines 32A and 32B of the transfer gates 124A to 124H. As shown in FIG. 26, the control signal lines 32A and 32B are maintained at the low level in a ready condition so as to maintain all the transfer gates 124A to 124H in an off condition, and then, the control signal lines 32A and 32B are selectively brought to the high level, so as to interconnect some number of data signal sub-lines so as to cause the parasitic capacitance CD at the data reading time to fulfil the equations (4) and (5). Alternatively, as shown by dotted lines in FIG. 26, in a ready condition the control signal lines 32A and 32B are maintained at the high level so as to maintain all the transfer gates 124A to 124H in an on condition, and at the reading time, only the control signal lines 32A and 32B corresponding to the data signal sub-lines to be cut off are brought to the low level.

FIG. 26 illustrate the case in which the memory cell 101A is selected and the control line 32A is brought to the high level from the reading of the data from memory cell 101A until the completion of the sense amplification, and the control line 32B is brought to the high level when the data is read out from the memory cell 101A and to the low level before the sense amplification is started. But, the falling timing of the control line 32B can be delayed after the completion of the sense amplification, as shown in one-dot chain line in FIG. 26.

When the memory cell 101C or 101F is selected, the control operation of the control lines 32A and 32B is opposite to that mentioned above.

In addition, in the above mentioned embodiment, each pair of data signal sub-lines are interconnected by the transfer gate, but it is possible to constitute each group of three or more data signal sub-lines.

Figure 27:
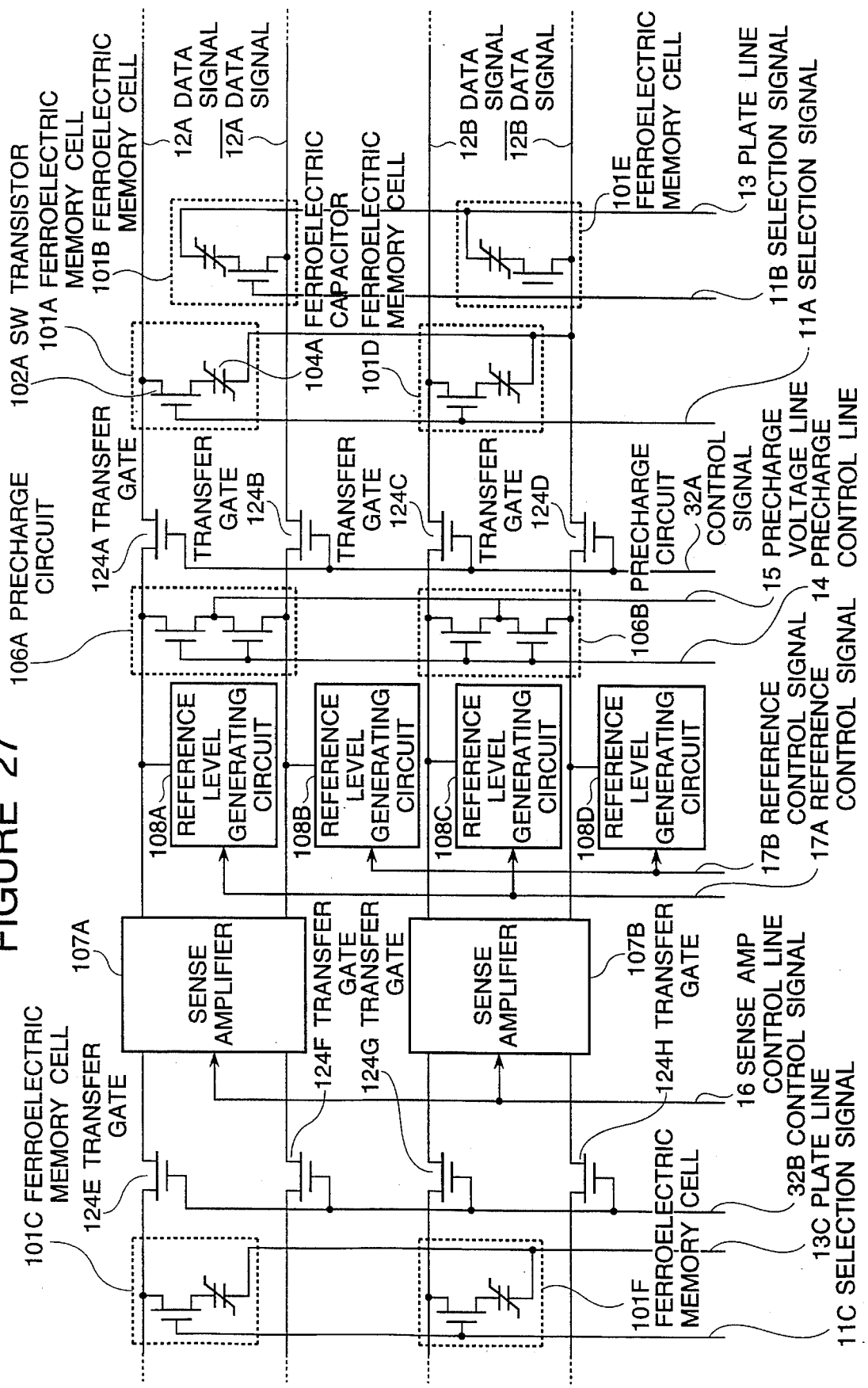
FIG. 27 is a circuit diagram of a seventh embodiment of the ferroelectric memory in accordance with the present invention, configured to adjust the data signal line parasitic capacitance by connecting a plurality of data signal lines.
Figure 28:
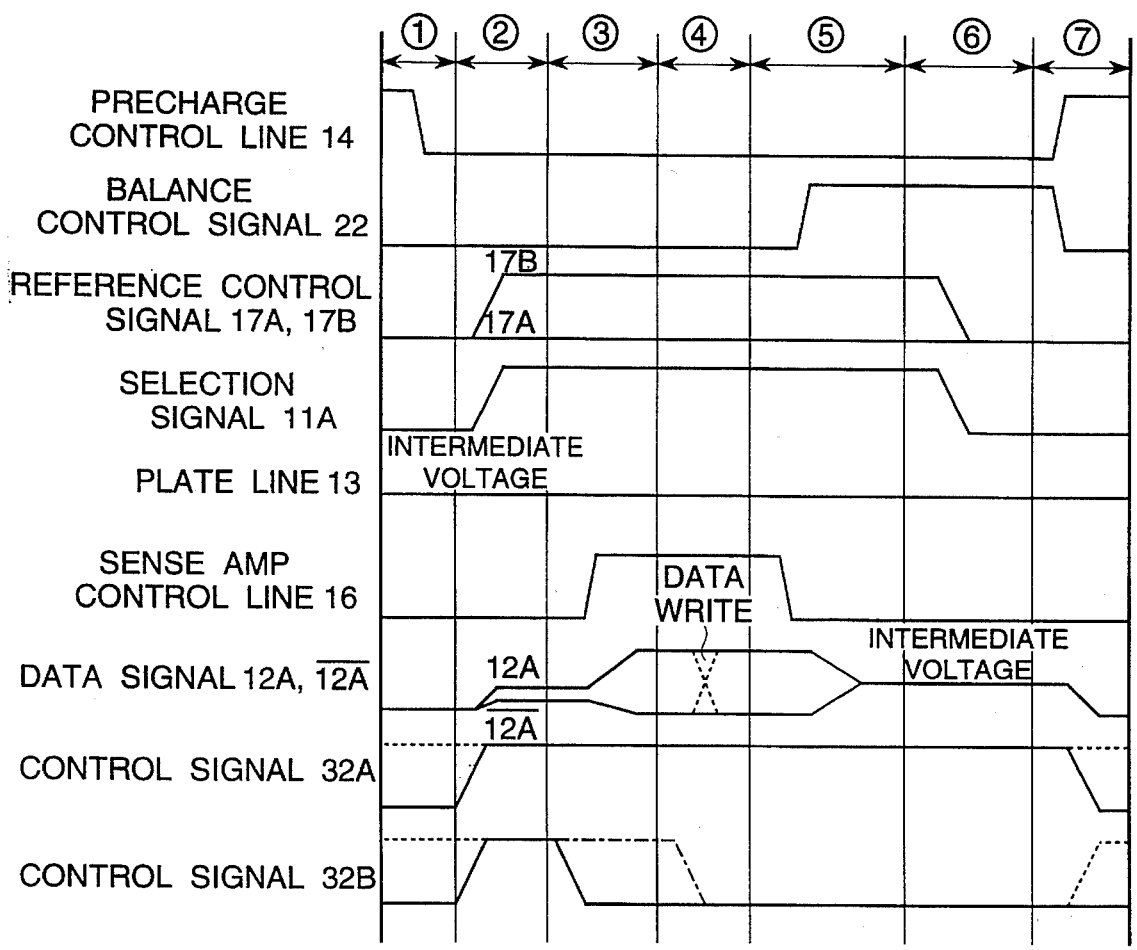
FIG. 28 is a timing chart illustrating an operation of the memory shown in FIG. 27.

FIG. 27 is a circuit diagram of a seventh embodiment of the ferroelectric memory in accordance with the present invention, applied to file plate non-drive type ferroelectric memory as shown in FIGS. 11 and 12, and FIG. 28 is a timing chart illustrating an operation of the memory shown in FIG. 27. The method for controlling the transfer gate control lines 32A and 32B is the same as that described just above in connection with FIG. 26. The other operation is the same as that described in connection with FIG. 12.

Figure 29:
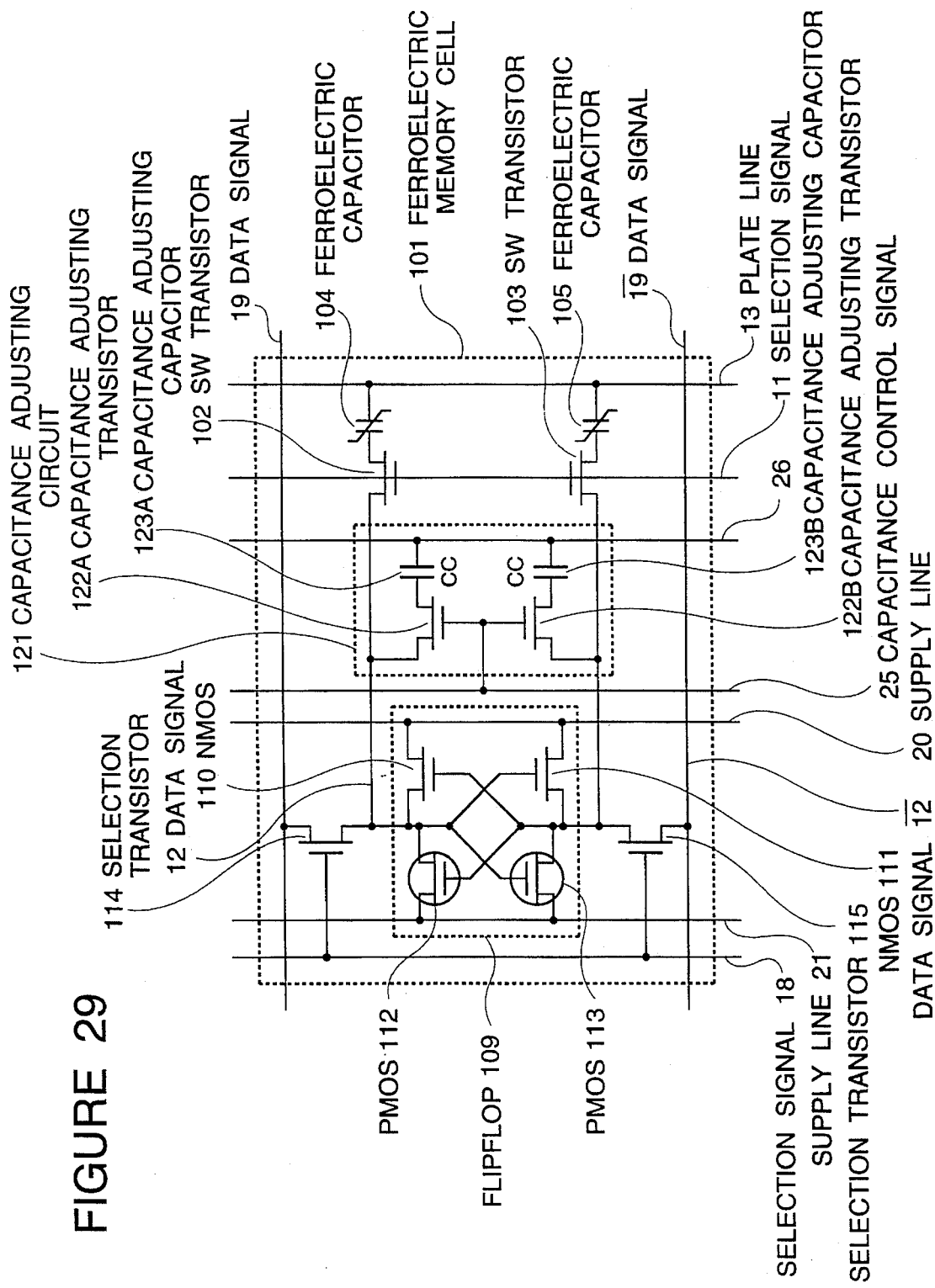
FIG. 29 is a circuit diagram of an eighth embodiment of the ferroelectric memory in accordance with the present invention, which is a "SRAM+ferroelectric memory cell" type memory.

Next, an embodiment in which the present invention is applied to the ferroelectric memory of the "SRAM+ferroelectric memory cell" type. Referring to FIG. 29, there is shown a circuit diagram of an eighth embodiment of the ferroelectric memory in accordance with the present invention, which is a "SRAM+ferroelectric memory cell" type memory.

Figure 9:
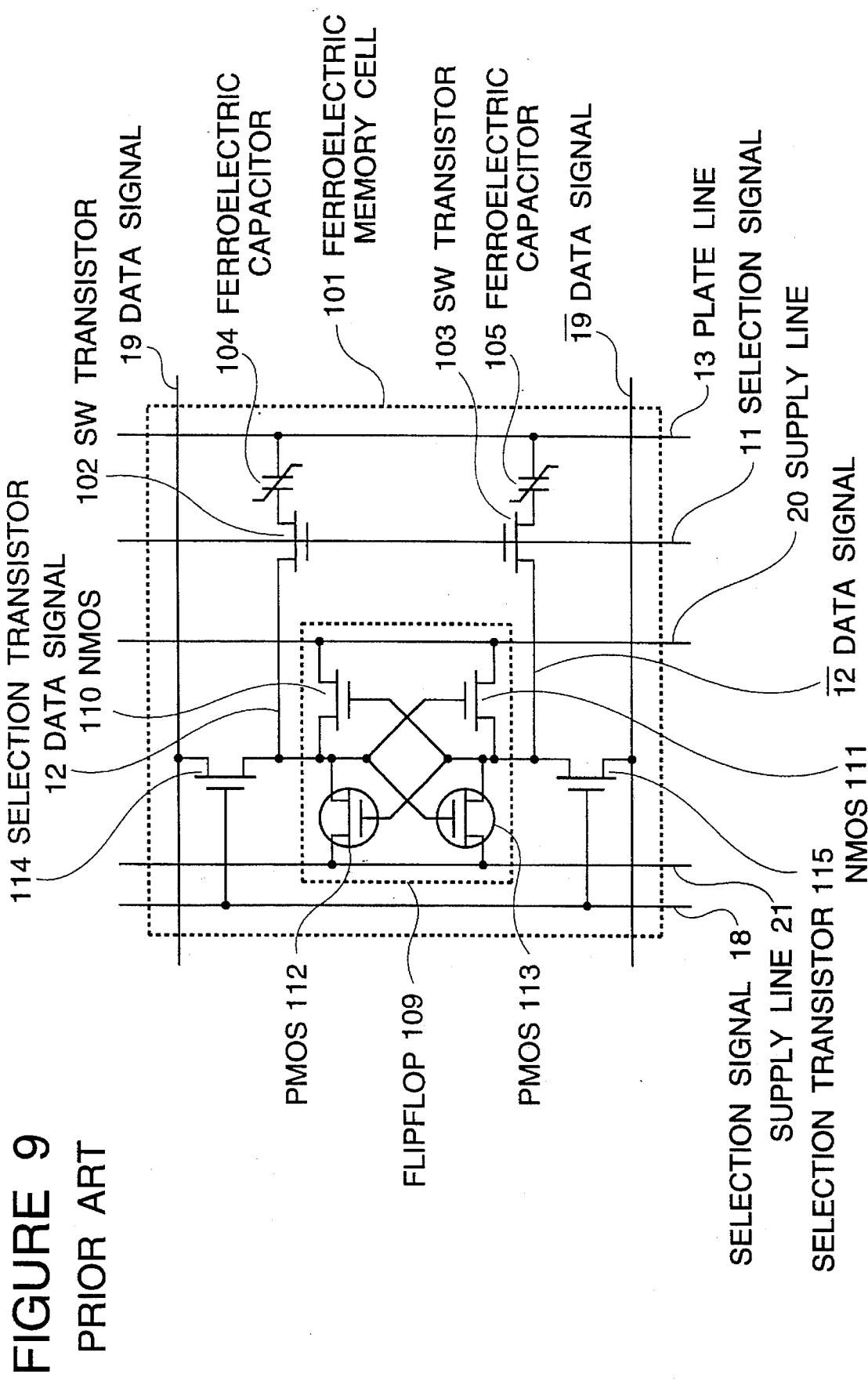
FIG. 9 is a circuit diagram of one memory cell of the "SRAM+ferroelectric memory cell" memory.

As seen from FIG. 29, the conventional ferroelectric memory of the "SRAM+ferroelectric memory cell" type as shown in FIG. 9 is added with a circuit 121 composed of transistors 122A and 122B capacitors 123A and 123B having a capacitance CC. The transistors 122A and 122B are controlled by a data signal line capacitance adjusting circuit control signal line 25. One end of each of the capacitors 123A and 123B is connected to an internal capacitor terminal line 26 of data signal line capacitance adjusting circuit. The data signal line capacitance adjusting circuit 121 can be connected directly to the ferroelectric capacitors 104 and 105, as shown in FIG. 30 illustrating a ninth embodiment of the present invention.

Figure 10:
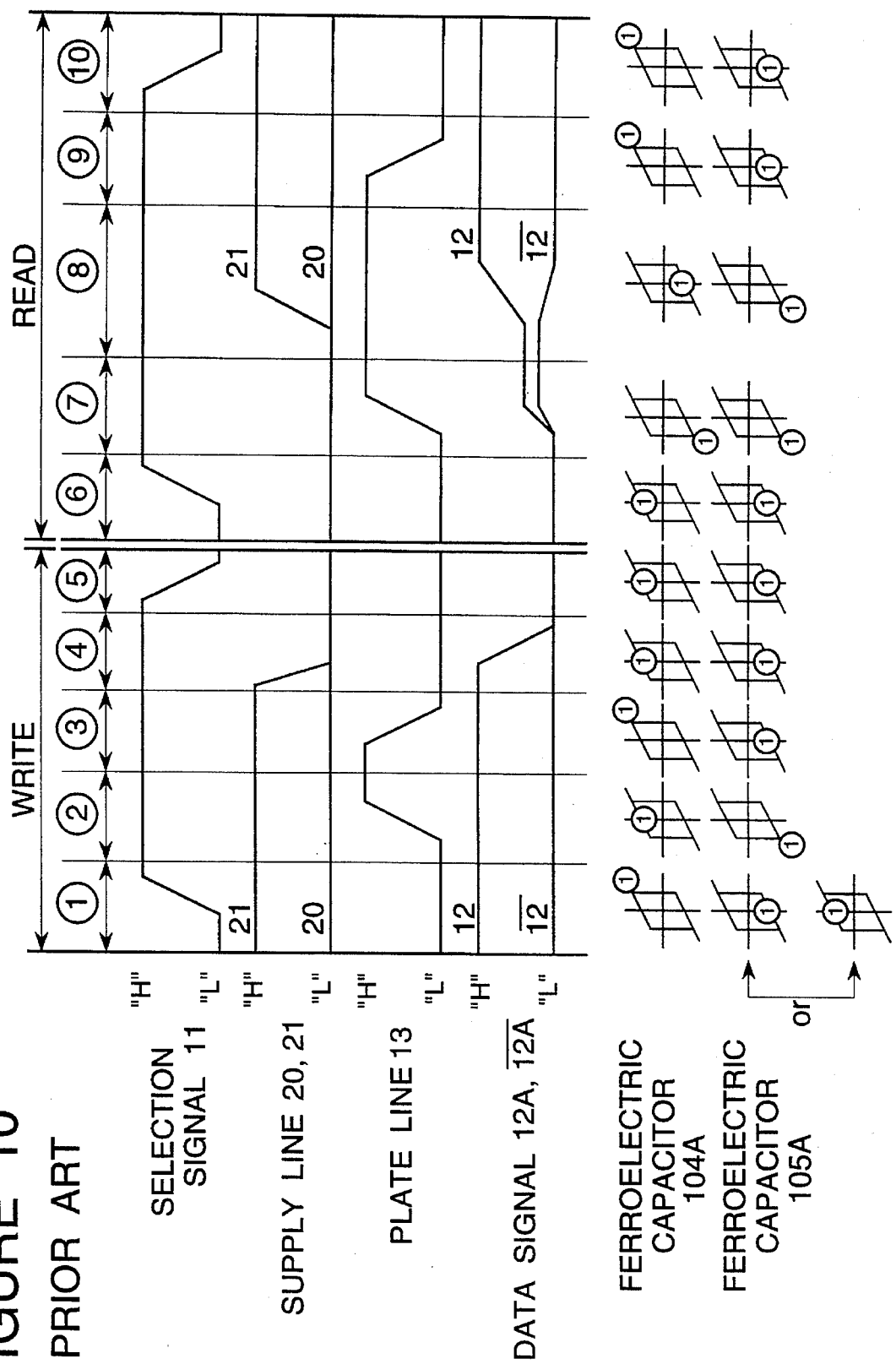
FIG. 10 is a timing chart illustrating an operation of the memory cell shown in FIG. 9.
Figure 30:
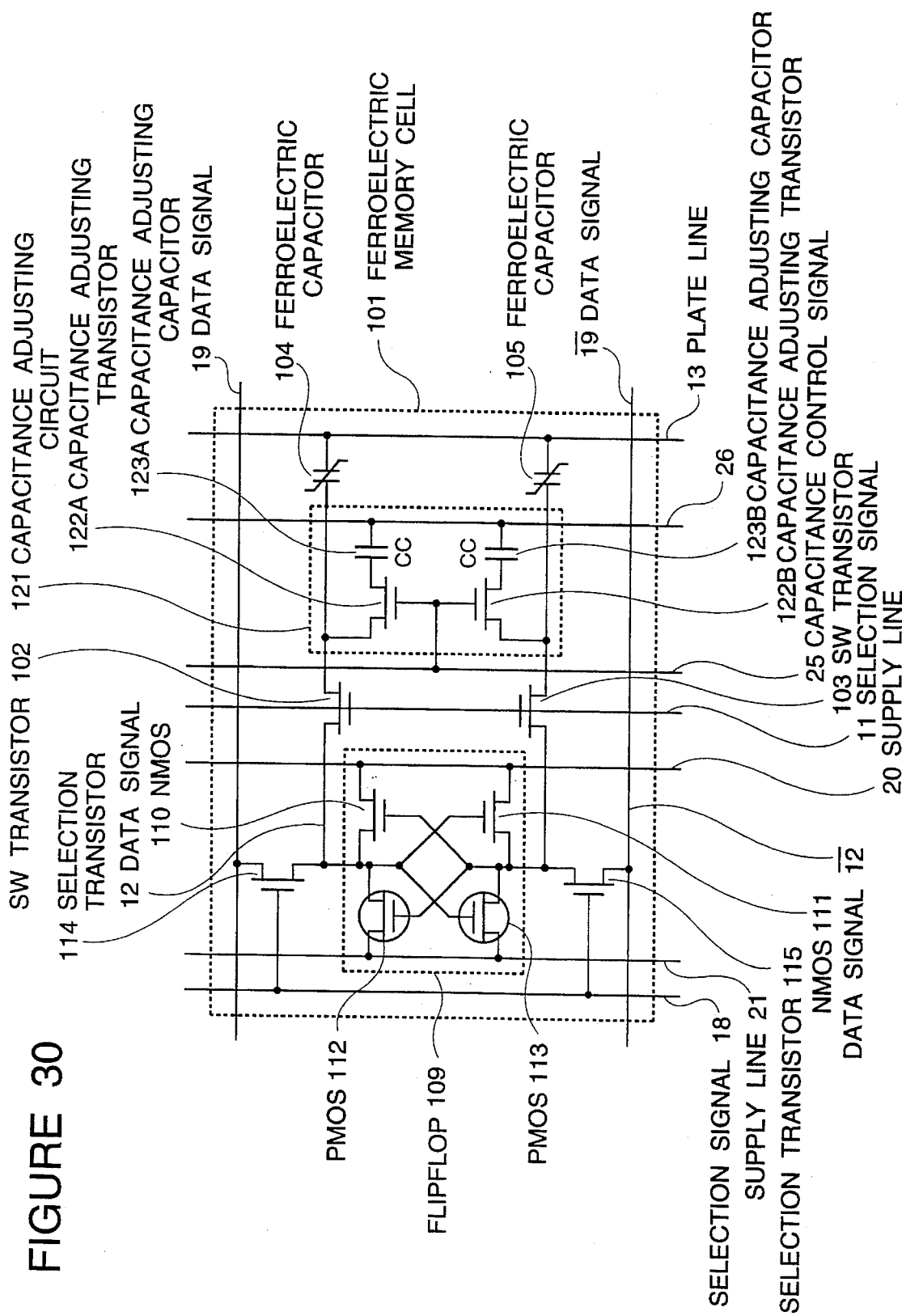
FIG. 30 is a circuit diagram of a ninth embodiment of the ferroelectric memory in accordance with the present invention, which is a "SRAM+ferroelectric memory cell" type memory.
Figure 31:
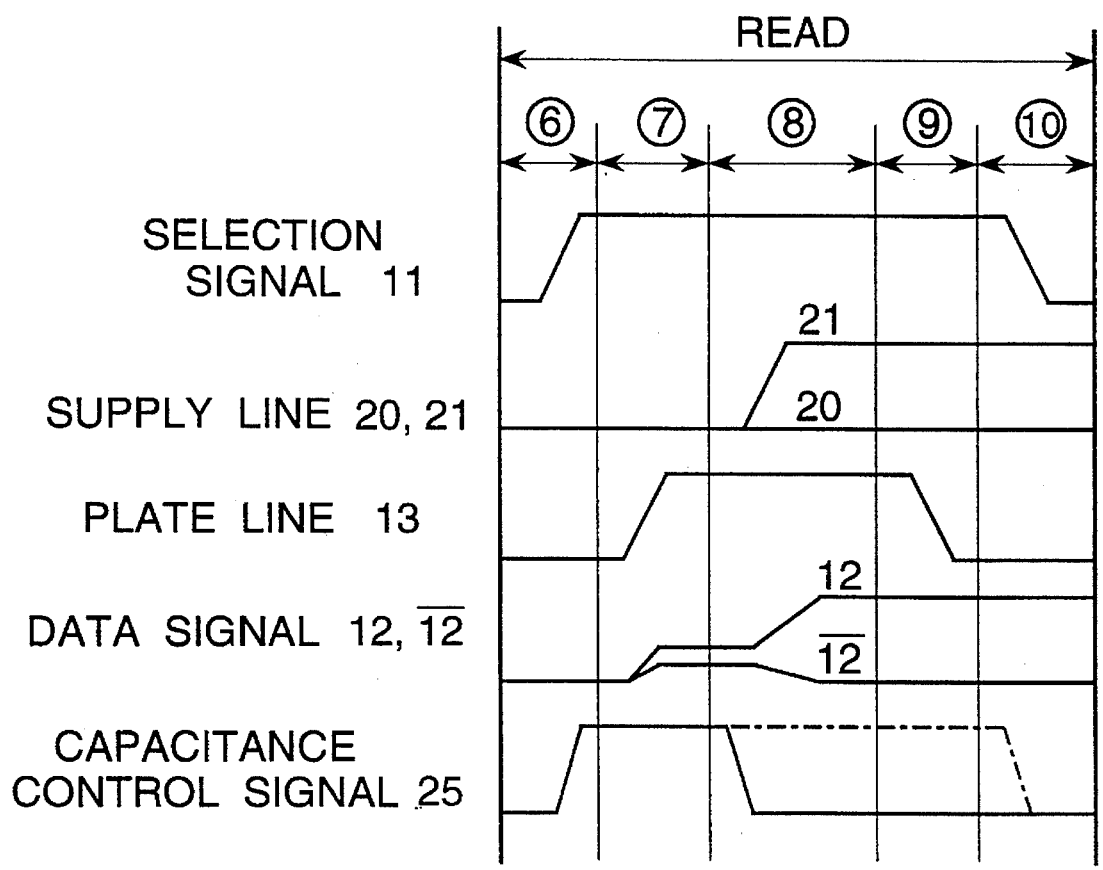
FIG. 31 is a timing chart illustrating an operation of the memory shown in FIGS. 29 and 30.

FIG. 31 is a timing chart illustrating an operation of the memory shown in FIGS. 29 and 30. The operation of writing the data from the flipflop 109 to the ferroelectric capacitors 104 and 105 can be performed similarly to the operation during the periods (1) to (5) shown in FIG. 10. The operation of reading the data from the ferroelectric capacitors 104 and 105 to the flipflop 109 can be performed as shown in periods (6) to (10) in FIG. 31.

Before or at the same time as the selection signal line 11 is brought to a high level, the data signal line capacitance adjusting circuit control signal line 25 is brought to the high level, so that the capacitance CC is added to the data lines 12 and/12. This capacitance CC is set to fulfil one of the equations (4), (5), (10), (11) and (16). Thereafter, the flipflop power supply line 21 is brought to the high level in a period from the falling timing of the control signal line 25 shown by the solid line in FIG. 31 to the fading timing of the control signal line 25 shown by the one-dot chain line in FIG. 31. In other words, the control signal line 25 is brought to the low level before, during or after the data is amplified by the flipflop 109.

Figure 32:
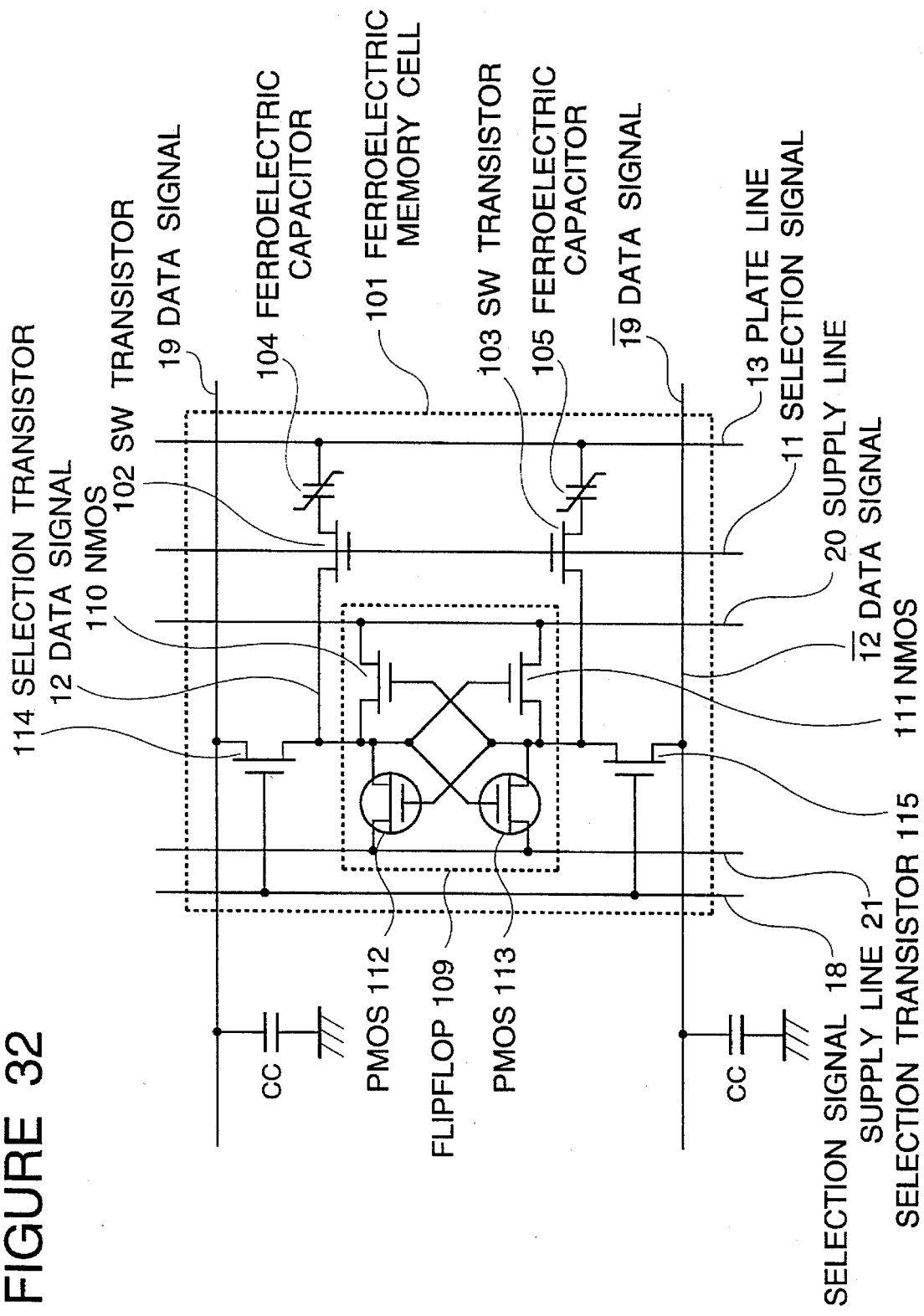
FIG. 32 is a circuit diagram of a tenth embodiment of the ferroelectric memory in accordance with the present invention, which is a "SRAM+ferroelectric memory cell" type memory.
Figure 33:
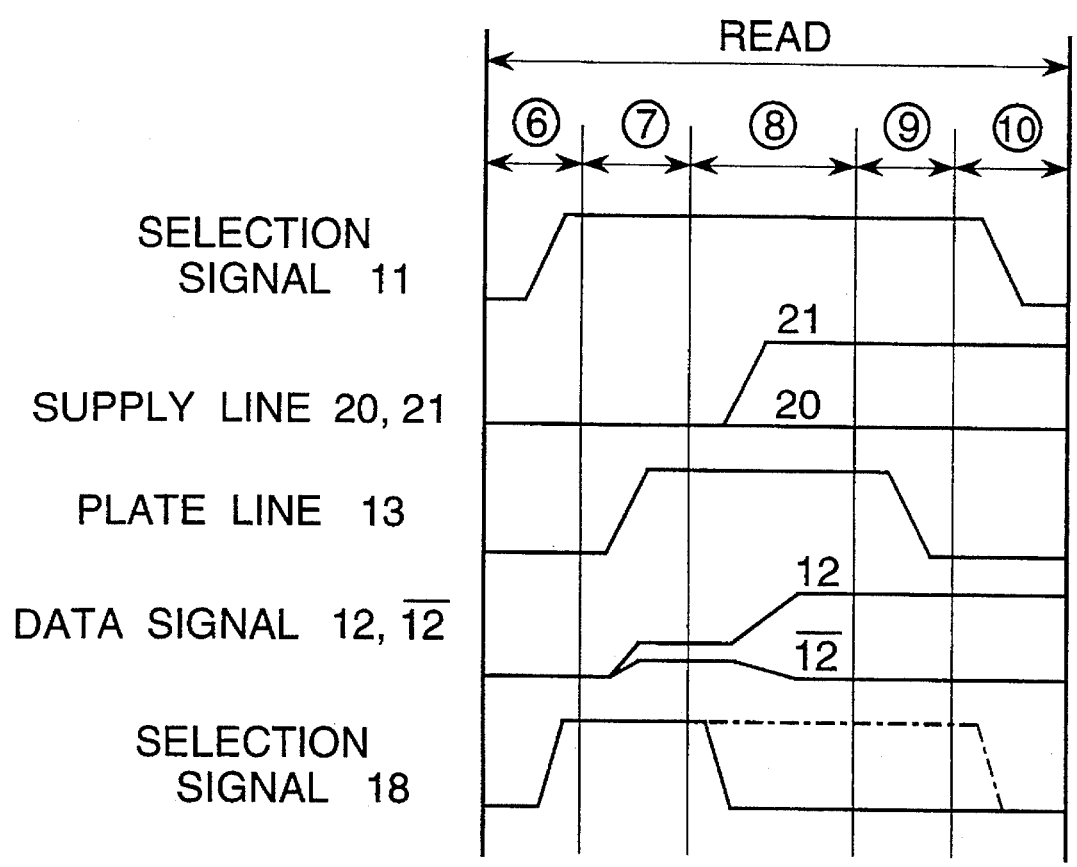
FIG. 33 is a timing chart illustrating an operation of the memory shown in FIG. 32.

In place of providing each one data signal line capacitance adjusting circuit 121 for each one memory cell as shown in FIGS. 30 and 31, it is possible to provide each data signal line capacitance adjusting capacitor to each data signal line, as shown in FIG. 32, which is a circuit diagram of a tenth embodiment of the ferroelectric memory in accordance with the present invention, which is a "SRAM+ferroelectric memory cell" type memory. FIG. 33 is a timing chart illustrating an operation of the memory shown in FIG. 32.

In the embodiment in which each of the data signal lines 19 and/19 for the SRAM is connected with a capacitance CC which fulfils one of the equations (4), (5), (10), (11) and (16), the memory cell selection signal line 18 for the SRAM is driven similarly to the data signal line capacitance adjusting circuit control signal line 25 in FIG. 29 and 30. In this case, the capacitance CC may be a wiring capacitance or an intentionally added capacitor.

Figure 34:
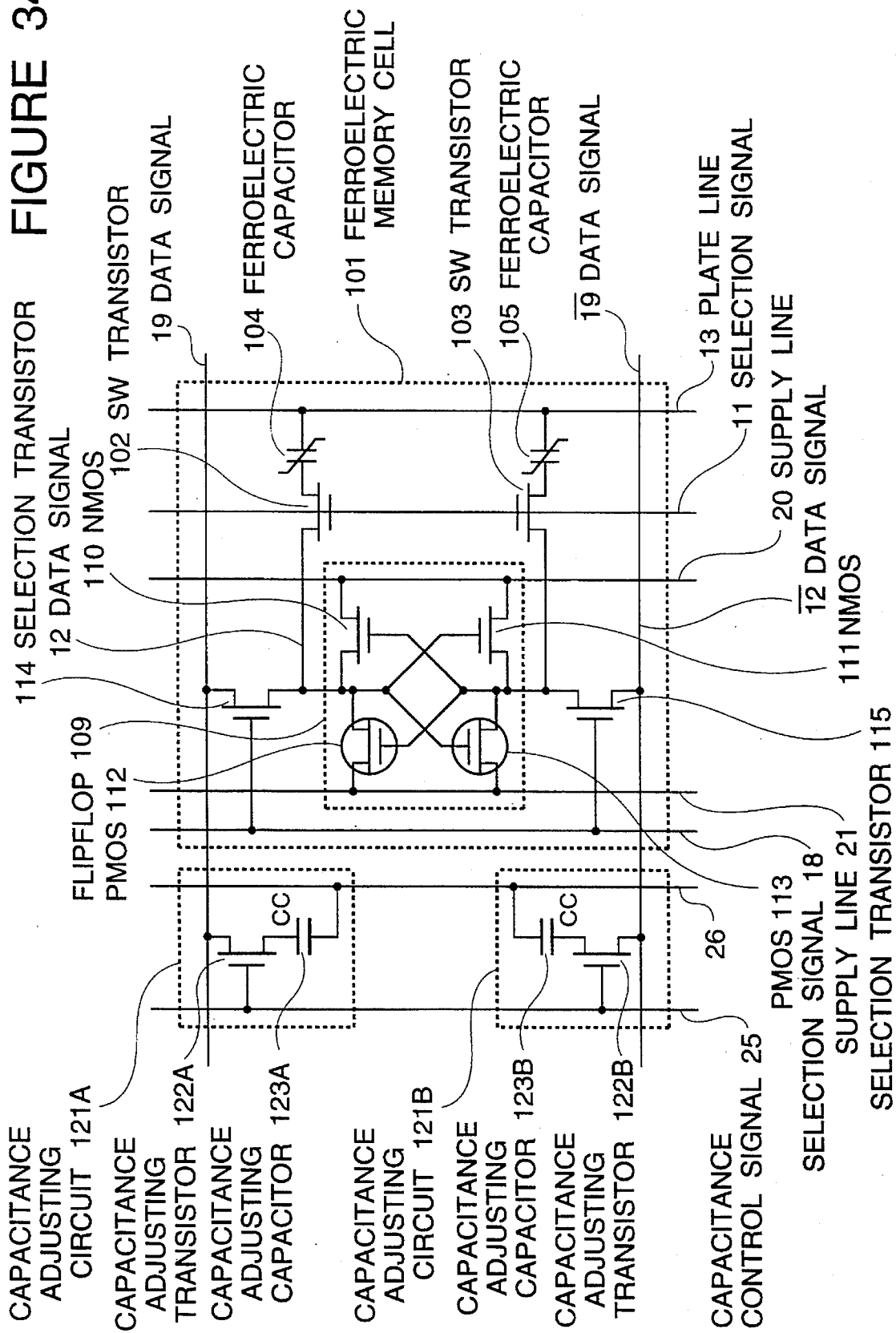
FIG. 34 is a circuit diagram of an eleventh embodiment of the ferroelectric memory in accordance with the present invention, which is a "SRAM+ferroelectric memory cell" type memory.
Figure 35:
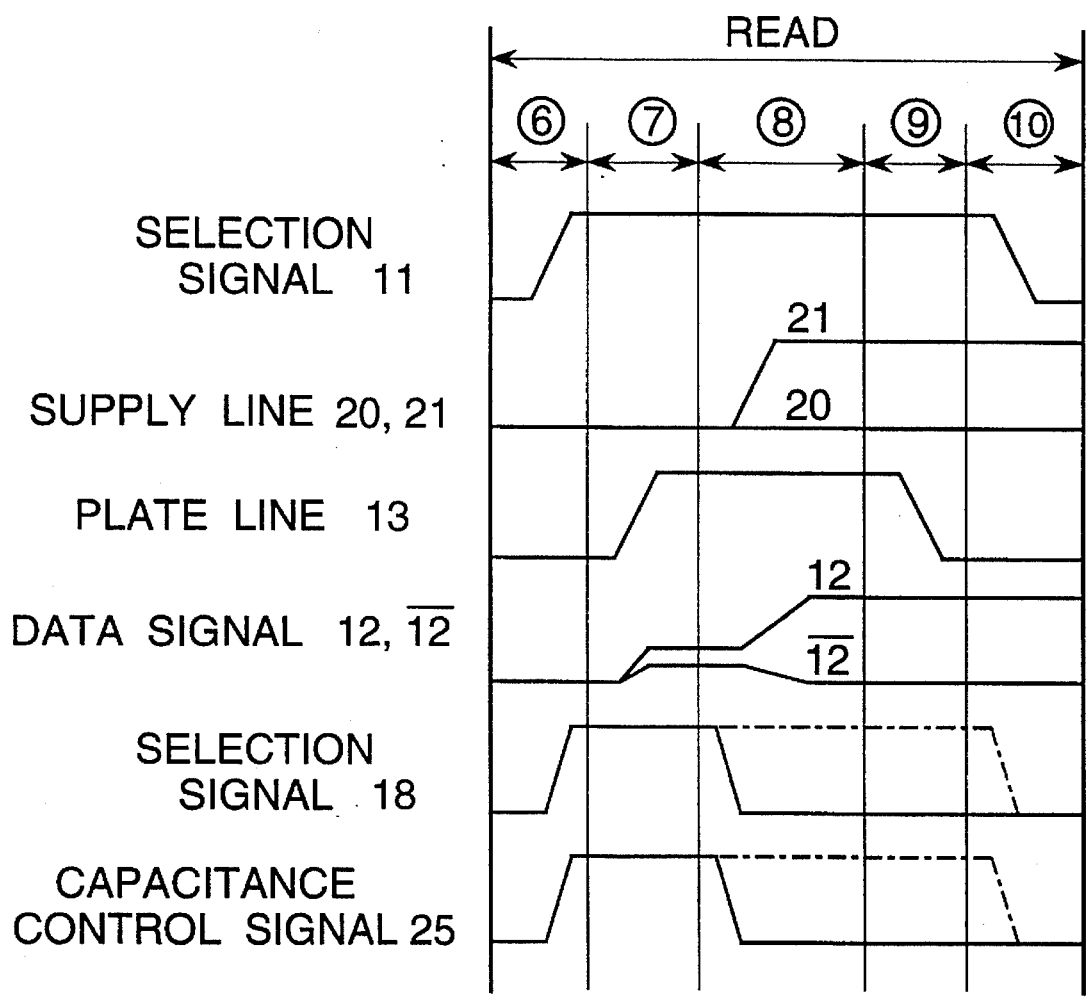
FIG. 35 is a timing chart illustrating an operation of the memory shown in FIG. 34.

Referring to FIG. 34, there is shown a circuit diagram of an eleventh embodiment of the ferroelectric memory in accordance with the present invention, which is a "SRAM+ferroelectric memory cell" type memory. In the eleventh embodiment, the two capacitances CC in FIG. 32 are respectively replaced by data signal line capacitance adjusting circuits 121A and 121B, each of which comprises a transistor 122A and 122B and a capacitor 123A and 123B. In this case, as shown in FIG. 35 is a timing chart illustrating an operation of the memory shown in FIG. 34, it is necessary to control the data signal line capacitance adjusting circuit control signal line 25 for the transistors 122A and 122B. It is sufficient if the signal line 25 is controlled at the same timing as that of the selection signal line 18.

In the above mentioned embodiments, the 1T/1C type memory cell, the 2T/2C type memory cell and the "SRAM+ferroelectric memory cell" type have been used as the memory cell, but the present invention is not limited to only these types of memory. The present invention can be similarly applied to all ferroelectric memories having such an operating system in which when a voltage is applied between opposing electrodes of the ferroelectric capacitor in order to read out the data from the ferroelectric memory cell, a voltage variation occurs on a node connected to the electrode of the ferroelectric capacitor, and the voltage variation is a problem. The above mentioned embodiments can be selectively combined to realize the memory which can realize the present invention.

As seen from the above, the ferroelectric memory in accordance with the present invention can avoid the problem of the prior art in which when the data is read out from the memory cell, the voltage of the data signal line varies, so that a voltage not smaller than the coercive voltage is not applied between the opposing electrodes of the ferroelectric capacitor, with the result that a sufficient read-out signal voltage cannot be obtained. Therefore, a stable operation of the ferroelectric memory can be realized.

The invention has thus been shown and described with reference to the specific embodiments. However, it should be noted that the present invention is in no way limited to the details of the illustrated structures but changes and modifications may be made within the scope of the appended claims.

I claim:

1. A ferroelectric memory comprising a plurality of pairs of data signal lines for outputting and receiving data, a plurality of selection signal lines selected in accordance with an address signal, and a plurality of memory cells, wherein each memory cell is arranged along a corresponding pair of data signal lines of said plurality of pairs of data signal lines, wherein said memory cell is controlled by a corresponding one of said selection line signals, and wherein each said memory cells includes at least one ferroelectric capacitor having a capacitor dielectric comprising a ferroelectric material disposed between a pair of opposing electrodes, at least one switching means connected to said ferroelectric capacitor and one data signal line of said corresponding pair of data signal lines, wherein polarized conditions of said ferroelectric capacitor correspond to conditions of stored data in said ferroelectric capacitor, and wherein when a first voltage is applied between the opposing electrodes of said ferroelectric capacitor, a current flows between said ferroelectric capacitor and the corresponding data signal line, depending upon the polarized condition of said ferroelectric capacitor, and a voltage appears on the corresponding pair of data signal lines due to the current and said voltage is detected for the purpose of reading out the stored data;

a means connected to the corresponding one pair of data signal lines for detecting a voltage difference appearing between the corresponding pair of data signal lines; and a means connected to at least one data signal line of the corresponding pair of data signal lines for temporarily controlling a parasitic capacitance of said at least one data signal line of the corresponding pair of data signal lines to obtain an optimum capacitance value when said stored data is read out from a memory cell, and wherein said optimum value minimizes a variation of the voltage on said data signal line caused by factors other than the current flowing between said ferroelectric capacitor and said data signal line.

2. A ferroelectric memory claimed in claim 1 wherein said switching means of said memory cell comprises at least one transistor.

3. A ferroelectric memory claimed in claim 1 wherein said switching means of said memory cell comprises at least one transistor, wherein a first electrode of said ferroelectric capacitor is connected to a source of said at least one transistor and a second electrode of said ferroelectric capacitor is connected to a plate line, a drain of said transistor is connected to said data signal line of said corresponding pair of data signal lines, and a gate of said transistor is connected to said corresponding selection signal line.

4. A ferroelectric memory claimed in claim 1 wherein said memory cell includes first and second ferroelectric capacitors and first and second switching means, each comprising a transistor, wherein a first electrode of said first ferroelectric capacitor is connected to a source of said first transistor and a second electrode of said first ferroelectric capacitor is connected to a plate line, a drain of said first transistor is connected to said data signal line of said corresponding pair of data signal lines, and a gate of said first transistor is connected to said corresponding selection signal line, and a first electrode of said second ferroelectric capacitor is connected to a source of said second transistor and a second electrode of said second ferroelectric capacitor is connected to said plate line, a drain of said second transistor is connected to the other data signal line of said corresponding pair of data signal lines, and a gate of said second transistor is connected to said corresponding selection signal line.

5. A ferroelectric memory claimed in claim 1 wherein said memory cell includes one ferroelectric capacitor and said switching means comprises first and second transistors, wherein first and second opposing electrodes of said ferroelectric capacitor are connected to a source of said first transistor and a source of said second transistor, respectively, a drain of said first transistor is connected to said one data signal line of said corresponding pair of data signal lines, and a gate of said first transistor is connected to said corresponding selection signal line, a drain of said second transistor is connected to the other data signal line of said corresponding pair of data signal lines, and a gate of said second transistor is connected to said corresponding selection signal line.

6. A ferroelectric memory claimed in claim 1 wherein said memory cell includes a flipflop, said flipflop comprising a plurality of transistors.

7. A ferroelectric memory claimed in claim 1 wherein said memory cell includes a flipflop and first and second ferroelectric capacitors, said flipflop comprising a plurality of transistors wherein two data signal terminals of said flipflop are respectively connected through first and second transfer gates to a pair of signal lines which are connected to a differential type sense amplifier, said data signal terminals of said flipflop being respectively connected through third and fourth transfer gates to a first electrode of said first and second ferroelectric capacitors, a control terminal of said first and second transfer gates being connected to said said corresponding one of said selection signal lines, a control terminal of said third and fourth transfer gates being connected to a control signal line, and a second electrode of said first and second ferroelectric capacitors being connected to a plate line.

8. A ferroelectric memory claimed in claim 1 further including:

means for data from said memory cell by setting the corresponding data signal line connected to said memory cell to be read out to a second voltage, by setting a plate line connected to said memory cell to be read out to a third voltage, wherein said third voltage which is different from said second voltage, by setting said selection signal line connected to said memory cell to be read out to a fifth voltage for selecting said memory cell to be read out, so that a voltage difference is caused to occur between the opposing electrodes of said ferroelectric capacitor, whereby a signal corresponding to the data stored in said memory cell is outputted to the corresponding data signal line; and means for setting a parasitic capacitance CD of said corresponding data signal line to fulfil the following relationship:

$$\left| \frac{CS \times (VPL0 - VS0) + CD \times (VPL - VDL0)}{CD + CS} \right| \geq Vc$$

where
CS is a capacitance of the normal dielectric component of said ferroelectric capacitor;
Vc is a coercive voltage converted by multiplying a coercive electric field of said ferroelectric capacitor by a film thickness of a ferroelectric material of said ferroelectric capacitor;
VPL0 is said fifth voltage;
VPL is said third voltage;
VDL0 is said second voltage;
VS0 is an initial voltage of a node interconnecting said switching means of said memory cell and said ferroelectric capacitor before the reading operation, so that a voltage variation on said data signal line caused by driving said plate line at the time of reading the data is minimized, whereby a voltage not smaller than said coercive voltage is applied between said opposing electrodes of said ferroelectric capacitor.

9. A ferroelectric memory claimed in claim 8 wherein said parasitic capacitance setting means includes a circuit having a capacitor having a capacitance enabling said parasitic capacitance setting means to fulfil said relationship when said capacitor is connected to said corresponding data signal line through a switch means, wherein said switch means is controlled by a control signal so as to connect said capacitor to said corresponding data signal line when the stored data is read.

10. A ferroelectric memory claimed in claim 8 wherein said parasitic capacitance setting means includes a plurality of data signal sub-lines which constitute one data signal line as a whole, and a plurality of second switching means, wherein each second switching means interconnects at least two adjacent data signal sub-lines of said plurality of data signal sub-lines, said plurality of second switching means being selectively controlled by a control signal so as to interconnect selected data signal sub-lines of said plurality of data signal sub-lines, thereby setting said parasitic capacitance to fulfil said relationship.

11. A ferroelectric memory claimed in claim 1 further including:

means for reading data from said memory cell by setting the corresponding data signal line connected to said memory cell to be read out to a second voltage, by setting a plate line connected to said memory cell to be read out to a third voltage, wherein said third voltage is a fixed voltage different from said second voltage, by setting said selection signal line connected to said memory cell to be read out to a fourth voltage for selecting said memory cell to be read out, so that a voltage difference is caused to occur between the opposing electrodes of said ferroelectric capacitor, whereby a signal corresponding to the data stored in said memory cell to be read out is outputted to the corresponding data signal line; and means for setting a parasitic capacitance CD of said corresponding data signal line to fulfil the following relationship:

$$\left| \frac{CS \times (VPLC - VS0) + CD \times (VPLC - VDL0)}{CD + CS} \right| \geq Vc$$

where
CS is a capacitance of the normal dielectric component of said ferroelectric capacitor;
Vc is a coercive voltage converted by multiplying a coercive electric field of said ferroelectric capacitor by a film thickness of a ferroelectric material of said ferroelectric capacitor;
VPLC is said third voltage;
VDLO is said second voltage; and
VSO is an initial voltage of a node interconnecting said switching means of said memory cell and said ferroelectric capacitor before the reading operation,
so that a voltage variation on said data signal line caused by driving said plate line at the time of reading the data is minimized, whereby a voltage not smaller than said coercive voltage is applied between said opposing electrodes of said ferroelectric capacitor.

12. A ferroelectric memory claimed in claim 11 wherein said parasitic capacitance setting means includes a circuit having a capacitor having a capacitance enabling said parasitic capacitance to fulfil said relationship when said capacitor is connected to said corresponding data signal line through a switch means, wherein said switch means is controlled by a control signal so as to connect said capacitor to said corresponding data signal line when the stored data is read.

13. A ferroelectric memory claimed in claim 11 wherein said parasitic capacitance setting means includes a plurality of data signal sub-lines which constitute one data signal line as a whole, and a plurality of second switching means, wherein each second switching means interconnects at least two adjacent data signal sub-lines of said plurality of data signal sub-lines, said plurality of second switching means being selectively controlled by a control signal so as to interconnect selected data signal sub-lines of said plurality of data signal sub-lines, thereby setting said parasitic capacitance to fulfil said relationship.

14. A method for reading out data from a ferroelectric memory, wherein said memory comprises, a plurality of pairs of data signal lines for outputting and receiving data, a plurality of selection signal lines selected in accordance with an address signal, and a plurality of memory cells, wherein each memory cell is arranged along a corresponding pair of data signal lines of said plurality of pairs of data signal lines, and wherein each said memory cell includes
at least one ferroelectric capacitor having a capacitor dielectric comprising a ferroelectric material disposed between a pair of opposing electrodes, at least one switching means connected to said ferroelectric capacitor and one data signal line of said corresponding pair of data signal lines,
wherein said memory cell is controlled by a corresponding one of said selection signal lines,
wherein polarized conditions of said ferroelectric capacitor correspond to conditions of stored data in said ferroelectric capacitor, and
wherein when a first voltage is applied between the opposing electrodes of said ferroelectric capacitor, a current flows between said ferroelectric capacitor and the corresponding data signal line, and a voltage appears on the corresponding pair of data signal lines due to the current and said voltage is detected for the purpose of reading out the stored data;

a means connected to the corresponding one pair of data signal lines for detecting a voltage difference appearing between the corresponding pair of data signal lines; and
a means connected to at least one data signal line of the corresponding pair of data signal lines for temporarily controlling a parasitic capacitance of said at least one data signal line of the corresponding pair of data signal lines to obtain an optimum capacitance value when said stored data is read out from a memory cell,
said method for reading of data from said memory cell comprising the steps of:
setting said optimum capacitance value to minimize a variation of the voltage on said data signal line cause by factors other than the current;
setting the corresponding data signal line connected to said memory cell to be read out to a second voltage;
setting a plate line connected to said memory cell to be read out to a third voltage, wherein said third voltage is different from said second voltage;
setting said selection signal line connected to said memory cell to be read out to a fifth voltage for selecting said memory cell to be read out, so that a voltage difference is caused to occur between the opposing electrodes of said ferroelectric capacitor, whereby a signal corresponding to the data stored in said memory cell to be read out is outputted to the corresponding data signal line.

15. A method claimed in claim 14 wherein, under the assumption that a parasitic capacitance of said corresponding data signal line is CD; a capacitance of the normal dielectric component of said ferroelectric capacitor is CS; a coercive voltage converted by multiplying a coercive electric field of said ferroelectric capacitor by a film thickness of a ferroelectric material of said ferroelectric capacitor is Vc; said fifth voltage is VPL0; said third voltage is VPL; said second voltage is VDL0; and an initial voltage of a node interconnecting said switching means of said memory cell and said ferroelectric capacitor before the reading operation, is VSO, said parasitic capacitance of said corresponding data signal line CD is determined to fulfil the following relationship:

$$\left| \frac{CS \times (VPL0 - VS0) + CD \times (VPL - VDL0)}{CD + CS} \right| \geq Vc$$

so that a voltage variation on said data signal line caused by driving said plate line at the time of reading the data is minimized, whereby a voltage not smaller than said coercive voltage is applied between said opposing electrodes of said ferroelectric capacitor.

16. A method claimed in claim 14, wherein said ferroelectric memory further comprises at least one sense amplifier connected to at least one pair of data signal lines, and wherein under the assumption that:
a signal voltage corresponding to data read out from said memory cell is VSIG, and
a minimum voltage value which can be normally amplified by said sense amplifier is VSE, a relationship of VSIG≧VSE is fulfilled.

17. A method claimed in claim 14, wherein said ferroelectric memory further comprises at least one sense amplifier connected to at least one pair of data signal lines, and wherein under the assumption that:
a parasitic capacitance of said corresponding data signal line is CD;
a capacitance of the normal dielectric component of said ferroelectric capacitor is CS;

a remnant polarization electric charge of said ferroelectric capacitor is Qr; and a minimum voltage value which can be normally amplified by said sense amplifier is VSE, said parasitic capacitance CD of said corresponding data signal line is determined to fulfil the following relationship:

$$\frac{Qr}{CD + CS} \geq VSE.$$

18. A method claimed in claim 14, wherein said ferroelectric memory further comprises at least one sense amplifier connected to at least one pair of data signal lines, and wherein under the assumption that:

a parasitic capacitance of said corresponding data signal line is CD;

a capacitance of the normal dielectric component of said ferroelectric capacitor is CS;

a remnant polarization electric charge of said ferroelectric capacitor is Qr; and a minimum voltage value which can be normally amplified by said sense amplifier is VSE, said parasitic capacitance CD of said corresponding data signal line is determined to fulfil the following relationship:

$$\frac{2 \times Qr}{CD + CS} \geq VSE.$$

19. A method claimed in claim 15 wherein said ferroelectric memory further includes a means for setting said parasitic capacitance, said parasitic capacitance setting means including a circuit having a capacitor and at least one switch means, wherein said switch means is connected between said capacitor and said corresponding data signal line, and wherein said parasitic capacitance setting means is controlled by a control signal so as to connect said capacitor to said corresponding data signal line when the data is read, and wherein said ferroelectric memory further comprises at least one sense amplifier connected to at least one pair of data signal lines, and wherein the method includes the steps of:

activating said sense amplifier after the data is read out from the selected memory cell so that the read-out data is sense-amplified by said sense amplifier, and switching said switch means before, during or after the read-out data is sense-amplified by said sense amplifier such that said capacitor is separated from said corresponding data signal line.

20. A method claimed in claim 19 wherein when data supplied from a source external to said ferroelectric memory is written to a selected memory cell via a data signal line corresponding to said selected memory, said switch means which is connected to the data signal line connected to said selected memory cell assumes a state such that said capacitor is separated from said corresponding data signal line.

21. A method claimed in claim 15 wherein said ferroelectric memory includes a means for setting said parasitic capacitance, wherein said parasitic capacitance setting means includes a plurality of data signal sub-lines which constitute one data signal line as a whole, and a plurality of second switching means, wherein each second switching means interconnects at least two adjacent data signal sub-lines of said plurality of data signal sub-lines, and wherein said plurality of second switching means is selectively controlled by a control signal so as to interconnect selected data signal sub-lines of said plurality of data signal sub-lines, thereby setting said parasitic capacitance to fulfil said relationship.

22. A method claimed in claim 21 wherein said ferroelectric memory further comprises at least one sense amplifier connected to at least one pair of data signal lines, wherein the method includes the steps of:

activating said sense amplifier after the data is read out from the selected memory cell so that the read-out data is sense-amplified by said sense amplifier, and switching said switch means before, during or after the read-out data is sense-amplified by said sense amplifier such that said capacitor is separated from said corresponding data signal line.

23. A method claimed in claim 22 wherein when data supplied from a source external to said ferroelectric memory is written to a selected memory cell via a data signal line corresponding to said selected memory cell, said switch means connected to the data signal line connected to said selected memory cell assumes a state such that said plurality of data signal sub-lines are separated from one another.

24. A method for reading data from a ferroelectric memory wherein said memory comprises a plurality of pairs of data signal lines for outputting and receiving data, a plurality of selection signal lines selected in accordance with an address signal, and a plurality of memory cells, wherein each memory cell is arranged along a corresponding pair of data signal lines of said plurality of pairs of data signal lines, and wherein each said memory cell includes:

at least one ferroelectric capacitor having a capacitor dielectric comprising a ferroelectric material disposed between a pair of opposing electrodes, at least one switching means connected to said ferroelectric capacitor and one data signal line of said corresponding pair of data signal lines, wherein said memory cell is controlled by a corresponding one of said selection signal lines, wherein polarized conditions of said ferroelectric capacitor correspond to conditions of stored data in said ferroelectric capacitor, and wherein when a first voltage is applied between the opposing electrodes of said ferroelectric capacitor, a current flows between said ferroelectric capacitor and the corresponding data signal line, and a voltage appears on the corresponding pair of data signal lines due to the current and said voltage is detected for the purpose of reading out the stored data;

a means connected to the corresponding one pair of data signal lines for detecting a voltage difference appearing between the corresponding pair of data signal lines; and a means connected to at least one data signal line of the corresponding pair of data signal lines for temporarily controlling a parasitic capacitance of said at least one data signal line of the corresponding pair of data signal lines to obtain an optimum capacitance value when said stored data is read out from a memory cell, and wherein said optimum value minimizes a variation of the voltage on said data signal line caused by factors other than the current said ferroelectric capacitor, said method for reading data from said memory cell comprising the steps of setting the corresponding data signal line connected to said memory cell to be read out to a second voltage, setting a plate line connected to said memory cell to be read out to a third voltage, wherein said third voltage is a fixed voltage different from said second voltage, setting said selection signal line connected to said memory cell to be read out to a fourth voltage for selecting said memory cell to be read out, so that a voltage difference is caused to occur between the opposing electrodes of said ferroelectric capacitor, whereby a signal corresponding to the data stored in said memory cell to be read out is outputted to the corresponding data signal line.

25. A method claimed in claim 24 wherein, under the assumption that: a parasitic capacitance of said corresponding data signal line is CD; a capacitance of the normal dielectric component of said ferroelectric capacitor is CS; a coercive voltage converted by multiplying a coercive electric field of said ferroelectric capacitor by a film thickness of a ferroelectric material of said ferroelectric capacitor is Vc; said third voltage is VPLC; said second voltage is VDL0; and an initial voltage of a node interconnecting said switching means of said memory cell and said ferroelectric capacitor before the reading operation, is VS0, said parasitic capacitance CD of said corresponding data signal line is determined to fulfil the following relationship:

$$\left| \frac{CS \times (VPLC - VS0) + CD \times (VPLC - VDL0)}{CD + CS} \right| \geq Vc$$

so that a voltage variation on said data signal line caused by driving said plate line at the time of reading the data is minimized, whereby a voltage not smaller than said coercive voltage is applied between said opposing electrodes of said ferroelectric capacitor.

26. A method claimed in claim 24, wherein said ferroelectric memory further comprises at least one sense amplifier connected to at least one pair of data signal lines, and wherein under the assumption that:

a signal voltage corresponding to data read out from said memory cell is VSIG, and a minimum voltage value which can be normally amplified by said sense amplifier is VSE, a relationship of VSIG≧VSE is fulfilled.

27. A method claimed in claim 24, wherein said ferroelectric memory further comprises at least one sense amplifier connected to at least one pair of data signal lines, and wherein under the assumption that:

a parasitic capacitance of said corresponding data signal line is CD;

a capacitance of the normal dielectric component of said ferroelectric capacitor is CS;

a remnant polarization electric charge of said ferroelectric capacitor is Qr; and a minimum voltage value which can be normally amplified by said sense amplifier is VSE, said parasitic capacitance CD of said corresponding data signal line is determined to fulfil the following relationship:

$$\frac{Qr}{CD + CS} \geq VSE.$$

28. A method claimed in claim 24, wherein said ferroelectric memory further comprises at least one sense amplifier connected to at least one pair of data signal lines, and wherein under the assumption that:

a parasitic capacitance of said corresponding data signal line is CD;

a capacitance of the normal dielectric component of said ferroelectric capacitor is CS;

a remnant polarization electric charge of said ferroelectric capacitor is Qr; and a minimum voltage value which can be normally amplified by said sense amplifier is VSE, said parasitic capacitance CD of said corresponding data signal line is determined to fulfil the following relationship:

$$\frac{2 \times Qr}{CD + CS} \geq VSE.$$

29. A method claimed in claim 25 wherein said ferroelectric memory further includes a means for setting said parasitic capacitance, said parasitic capacitance setting means including a circuit having a capacitor and at least one switch means, wherein said switch means is connected between said capacitor and said corresponding data signal line, and wherein said setting means is controlled by a control signal so as to connect said capacitor to said corresponding data signal line when the data is read, and wherein said ferroelectric memory further comprises at least one sense amplifier connected to at least one pair of data signal lines, and wherein the method includes the steps of:

activating said sense amplifier after the data is read out from the selected memory cell so that the read-out data is sense-amplified by said sense amplifier, and switching said switch means before, during or after the read-out data is sense-amplified by said sense amplifier such that said capacitor is separated from said corresponding data signal line.

30. A method claimed in claim 29 wherein when data supplied from a source external to said ferroelectric memory is written to a selected memory cell via a data signal line corresponding to said selected memory cell, said switch means which is connected to the data signal line connected to said selected memory cell assumes a state such that said capacitor is separated from said corresponding data signal line.

31. A method claimed in claim 25 wherein said ferroelectric memory includes a means for setting said parasitic capacitance, wherein said parasitic capacitance setting means includes a plurality of data signal sub-lines which constitute one data signal line as a whole, and a plurality of second switching means, wherein each second switching means interconnects at least two adjacent data signal sub-lines of said plurality of data signal sub-lines, and wherein said plurality of second switching means is selectively controlled by a control signal so as to interconnect selected data signal sub-lines of said plurality of data signal sub-lines, thereby setting said parasitic capacitance to fulfil said relationship.

32. A method claimed in claim 31 wherein said ferroelectric memory further comprises at least one sense amplifier connected to at least one pair of data signal lines, wherein the method includes the steps of:

activating said sense amplifier after the data is read out from the selected memory cell that the read-out data is sense-amplified by said sense amplifier, and switching said switch means before, during or after the read-out data is sense-amplified by said sense amplifier such that said capacitor is separated from said corresponding data signal line.

33. A method claimed in claim 32 wherein when data supplied from a source external to said ferroelectric memory is written to a selected memory cell via a data signal line corresponding to said selected memory cell, said switch means connected to the data signal line connected to said selected memory cell assumes a state such that said plurality of data signal sub-lines are separated from one another.

* * * * *